United States Patent [19]
Dedic et al.

[11] Patent Number: 5,870,052
[45] Date of Patent: Feb. 9, 1999

[54] SUCCESSIVE APPROXIMATION TYPE ANALOG TO DIGITAL CONVERTER WITH REPETITIVE CONVERSION CYCLES

[75] Inventors: Ian Juso Dedic, Northolt; Andrew David Beckett, Wokingham, both of England

[73] Assignee: Fujitsu Microelectronic Limited, Berkshire, United Kingdom

[21] Appl. No.: 903,324

[22] Filed: Jul. 17, 1997

Related U.S. Application Data

[63] Continuation of Ser. No. 606,434, Feb. 23, 1996, abandoned.

[30] Foreign Application Priority Data

Feb. 24, 1995 [GB] United Kingdom ................. 9503783.4

[51] Int. Cl.$^6$ .............................. H03M 1/38; H03M 1/46
[52] U.S. Cl. ........................................... 341/161; 341/155
[58] Field of Search .................................... 341/155, 161, 341/162, 163, 164, 165, 118

[56] References Cited

U.S. PATENT DOCUMENTS

| | | | |
|---|---|---|---|
| 4,620,179 | 10/1986 | Cooper et al. | 340/347 |
| 4,686,507 | 8/1987 | Kessler | 340/347 |
| 4,989,004 | 1/1991 | Kanayama | 341/161 |
| 5,028,926 | 7/1991 | Tokuhiro | 341/161 |
| 5,394,147 | 2/1995 | Miyake | 341/161 |
| 5,424,736 | 6/1995 | Stryjewski | 341/161 |
| 5,561,427 | 10/1996 | Coleman, Jr. | 341/161 |
| 5,570,091 | 10/1996 | Noro et al. | 341/161 |
| 5,589,832 | 12/1996 | Grundyig et al. | 341/161 |

FOREIGN PATENT DOCUMENTS

| | | | |
|---|---|---|---|
| 0153778 | 9/1985 | European Pat. Off. | H03M 1/38 |
| 0214831 | 9/1996 | European Pat. Off. | H03M 1/40 |

OTHER PUBLICATIONS

Milcom 86, Conference Reocrd, vol. 2, 5–9 Oct. 1986 Monterey, California, pp. 19.4.1–19.4.9.
Reinagel, Trinary Logic Operations And Circuitry With Communication Systems Applications, pp. 19.4.3–p. 19.4.8; figures 13, 14.
The Art of Electronics, second edition 1989, P. Horowitz and W. Hill, pp. 622–624, Cambridge University Press.

*Primary Examiner*—Brian Young
*Assistant Examiner*—Peguy JeanPierre
*Attorney, Agent, or Firm*—Dan M. de la Rosa

[57] ABSTRACT

An analog-to-digital converter (ADC) operates repetitively to perform a series of conversion cycles. A comparator (9) receives an analog input signal ($V_{IN}$) and compares it with an analog comparison signal produced by a digital-to-analog converter (5). A successive-approximation register circuit (22) holds a digital trial signal value and uses it to control the value of the analog comparison signal in each conversion cycle so as to perform up to two comparisons per cycle, thereby to produce digital data that has a first value ("+1") when the input signal value is greater than a first comparison value ($V_{C1}$) and that has a second value ("−1") when the input signal value is less than a second comparison value ($V_{C2}$) and that in all other cases has a third value ("0"). The first comparison value ($V_{C1}$) is set higher than the trial signal value determined for use in the cycle concerned, and the second comparison value is set lower than that trial signal value. Each comparison value differs from the trial signal value by the same predetermined amount. The successive-approximation register circuit (22) adjusts the trial signal value in each cycle in dependence upon the digital data produced in the cycle concerned so as to tend to bring that value into closer correspondence with the input signal value.

Such an ADC can employ the same analog circuits (5,7,9) as a conventional successive-approximation ADC but can operate at higher speeds because errors in the decisions made in one conversion cycle are, within reasonable limits, corrected automatically in subsequent conversion cycles.

39 Claims, 19 Drawing Sheets

| CYCLE | WEIGHT | POS | NEG | THR | DOHI | 1st Comp. | 2nd Comp. | COMP$_{HI}$ | COMP$_{LO}$ |
|---|---|---|---|---|---|---|---|---|---|
| 1 | 16384 | 0 | 0 | 8192 | 0 | 24576 | 40960 | 1 | 0 |
| 2 | 8192 | 16384 | 0 | 4096 | 1 | 54248 | 45056 | 0 | 1 |
| 3 | 4096 | 16384 | 8192 | 2048 | 0 | 38912 | 43008 | 0 | 0 |
| 4 | 2048 | 16384 | 8192 | 1024 | 0 | 39936 | 41984 | 1 | 0 |
| 5 | 1024 | 18432 | 8192 | 512 | 1 | 43520 | 42496 | 0 | 1 |
| 6 | 512 | 18432 | 9216 | 250 | 0 | 41728 | 42240 | 1 | 0 |
| 7 | 256 | 18944 | 9216 | 128 | 0 | 42624 | 42368 | 0 | 0 |
| 8 | 128 | 18944 | 9216 | 64 | 1 | 42336 | 42432 | 0 | 1 |
| 9 | 64 | 18944 | 9344 | 32 | 1 | 42560 | 42400 | 0 | 0 |
| 10 | 32 | 18944 | 9344 | 16 | 0 | 42352 | 42384 | 0 | 0 |
| 11 | 16 | 18944 | 9344 | 8 | 1 | 42376 | – | 1 | – |
| 12 | 8 | 18944 | 9344 | 4 | 1 | 42388 | 42380 | 0 | 1 |
| 13 | 4 | 18960 | 9352 | 2 | 1 | 42374 | 42378 | 1 | – |
| 14 | 2 | 18960 | 9352 | 1 | 1 | 42381 | 42379 | 0 | 0 |
| 15 | 1 | 18964 | 9352 | 0 | X | 42380 | – | 0 | – |
| 16 | 1 | 18964 | 9353 | 0 | X | 42379 | – | 0 | – |

FIG. 6

|    | WEIGHT | POS  | NEG | THR   | 1ST COMP | COMP_TRIAL | 2ND COMP | COMP_HI | COMP_LO |
|----|--------|------|-----|-------|----------|------------|----------|---------|---------|
| 1  | 16384  | 0    | 0   | 16384 | 32768    | 1          | 49152    | 0       | -       |
| 2  | 8192   | 0    | 0   | 8192  | 32768    | 1          | 40960    | 1       | -       |
| 3  | 4096   | 8192 | 0   | 4096  | 40960    | 1          | 45056    | 0       | -       |
| 4  | 2048   | 8192 | 0   | 2048  | 40960    | 1          | 43008    | 0       | -       |
| 5  | 1024   | 8192 | 0   | 1024  | 40960    | 1          | 41984    | 1       | -       |
| 6  | 512    | 9216 | 0   | 512   | 41984    | 1          | 42496    | 0       | -       |
| 7  | 256    | 9216 | 0   | 256   | 41984    | 1          | 42240    | 1       | -       |
| 8  | 128    | 9472 | 0   | 128   | 42240    | 1          | 42368    | 1       | -       |
| 9  | 64     | 9600 | 0   | 64    | 42368    | 1          | 42432    | 0       | -       |
| 10 | 32     | 9600 | 0   | 32    | 42368    | 1          | 42400    | 0       | -       |
| 11 | 16     | 9600 | 0   | 16    | 42368    | 1          | 42384    | 0       | -       |
| 12 | 8      | 9600 | 0   | 8     | 42368    | 1          | 42376    | 1       | -       |
| 13 | 4      | 9608 | 0   | 4     | 42376    | 1          | 42380    | 0       | -       |
| 14 | 2      | 9608 | 0   | 2     | 42376    | 1          | 42378    | 1       | -       |
| 15 | 1      | 9610 | 0   | 1     | 42378    | 1          | -        | -       | -       |
| 16 | 0      | 9611 | 0   | -     | 42379    |            |          |         |         |

| 1 | 2 | 3 | 4 | 5 | 6 | 7 | 8 | 9 | 10 | 11 |
|---|---|---|---|---|---|---|---|---|----|----|
| ± 16K | ± 8K | ± 4K | ± 2K | ± 1K | ± 512 | ± 256 | ± 128 | ± 64 | ± 32 | ± 16 | ...

FIG. 18B

| 1 | 2 | 3=C | | 4 | 5 | 6=C | | 7 | 8 |
|---|---|---|---|---|---|---|---|---|---|
| ± 16K | ± 8K | ± 4K | ± 4K | ± 2K | ± 1K | ± 512 | ± 512 | ± 256 | ± 128 | ...

FIG. 18C

| 1 | 2 | 3 | 4 | 5 | 6 | 7 | 8=C | | 9 |
|---|---|---|---|---|---|---|---|---|---|
| ± 16K | ± 8K | ± 4K | ± 2K | ± 1K | ± 512 | ± 256 | ± 128 | ± 128 | ± 64 | ...

SUCCESSIVE APPROXIMATION TYPE ANALOG TO DIGITAL CONVERTER WITH REPETITIVE CONVERSION CYCLES

This is a continuation of application Ser. No. 08/606,434 filed on Feb. 23, 1996, now abandoned.

BACKGROUND OF THE INVENTION

1. Field of the Invention

The present invention relates to analog-to-digital converters, and in particular to analog-to-digital converters that employ a successive approximation technique.

2. Description of the Prior Art

FIG. 1 of the accompanying drawings shows a schematic block diagram of a conventional successive approximation analog-to-digital converter (ADC). Such an ADC is described, for example, in "The Art of Electronics", second edition 1989, P. Horowitz and W. Hill, Cambridge University Press.

The ADC 1 of FIG. 1 comprises a digital storage register (referred to as a successive approximation register or SAR) 3, a digital-to-analog converter (DAC) 5 and associated reference voltage generating circuit 7, a comparator 9, a control circuit 11 and associated clock generating circuit 13, and a digital output circuit 15.

In use of the FIG. 1 ADC, an analog input voltage $V_{IN}$ to be converted into a corresponding digital output word is applied to one input of the comparator 9. A "start conversion" signal is applied to one input of the control circuit 11. In response to this pulse, the control circuit 11 stores in the SAR 3 a first digital "trial" value, the most significant bit of which is one and the remaining bits of which are zero. This trial value in the SAR 3 is then loaded into the DAC 5 which produces a corresponding analog trial voltage $V_{TRIAL}$ that is applied to the other input of the comparator 9. The value of the first trial word is selected so that the trial voltage $V_{TRIAL}$ is initially set to half the full-scale output voltage of the DAC 5.

If the result COMP of the comparison between $V_{IN}$ and $V_{TRIAL}$ is that $V_{IN}$ is greater than $V_{TRIAL}$, the most significant bit of the SAR 3 is left at 1. Otherwise, that most significant bit is reset to 0.

Then, in the next conversion cycle of the ADC 1, the second most significant bit of the SAR 3 is set to 1, the other bits being unchanged. The resulting new digital trial value is applied to the DAC 5 which generates a different $V_{TRIAL}$. In dependence upon the result of the comparison performed by the comparator 9 between the new $V_{TRIAL}$ and $V_{IN}$, the level of the second most significant of the SAR 3 is determined in the same manner as in the first conversion cycle.

Operation of the ADC 1 continues in this way over successive cycles until the level of the least significant bit of the SAR 3 has been determined. At this point the control circuit 11 outputs an "end of conversion" signal and enables the output circuit 15 so that the content of the SAR 3 is output as a digital output word D.

Successive-approximation ADCs, such as that shown in FIG. 1, are relatively accurate and fast, requiring only n settling times of the DAC for n-bit precision. Typical conversion times are in the range from 1 to 50 $\mu s$, and accuracies of between 8 and 12 bits are commonly available.

However, the conversion speed of the FIG. 1 ADC is limited by the requirement that the decision regarding the level of each bit of the SAR 3 must be correct to an accuracy of better than 1 least significant bit (LSB). This is a particular problem in successive approximation ADCs where fast or high resolution is required, since before a valid decision for each bit can be made the analog circuits must settle accurately, and the comparator must resolve a small signal after a large overdrive.

BRIEF SUMMARY OF THE INVENTION

According to a first aspect of the present invention there is provided an analog-to-digital converter operable repetitively to perform a series of conversion cycles and including: comparator means connected for receiving an analog input signal and operable in each such conversion cycle to produce digital data that has a first value when the input signal value is greater than a first comparison value and that has a second value when the said input signal value is less than a second comparison value and that in all other cases has a third value, the said first comparison value being greater than a trial signal value determined by the converter for use in the cycle concerned and differing from that trial signal value by a first predetermined amount, and the said second comparison value being less than the said trial signal value and differing therefrom by a second predetermined amount; and successive approximation means operable in each conversion cycle to adjust the said trial signal value in dependence upon the said digital data produced in the cycle concerned so as to tend to bring that value into closer correspondence with the said input signal value.

Such an ADC can provide substantial improvements in speed over a conventional successive-approximation ADC without requiring any increase in the performance levels (settling time and comparison accuracy) of the comparator means (analog circuits). The determination of the trial signal value is self-correcting, within reasonable limits, so that any errors in the digital data produced in one conversion cycle due to incomplete settling and/or inaccuracy of the comparison are corrected automatically in later cycles. This allows the comparator means to be operated faster than in a conventional successive-approximation ADC.

In each conversion cycle the said successive approximation means preferably increase the said trial signal value by a predetermined upward adjustment amount when the said digital data produced in the conversion cycle concerned has the said first value and decrease the said trial signal value by a predetermined downward adjustment amount when that digital data has the said second value, and leave the trial signal value unchanged when that digital data has the said third value. The said predetermined upward adjustment amount may be made equal to the said predetermined downward adjustment amount in each conversion cycle.

Preferably, for at least one pair of successive conversion cycles, the said first predetermined amount in the later cycle of the pair is reduced as compared to the said first predetermined amount in the earlier cycle of the pair, and/or the said second predetermined amount in the later cycle of the pair is reduced as compared to the said second predetermined amount in the earlier cycle of the pair. For example, the said first predetermined amount in the later cycle of the pair may be substantially half the said first predetermined amount in the earlier cycle of the pair, and the said second predetermined amount in the later cycle of the pair may be substantially half the said second predetermined amount in the earlier cycle of the pair. Such halving can be implemented easily and conveniently by digital circuitry.

In each conversion cycle, the said first predetermined amount may be made equal to the said second predetermined amount.

The said trial signal value is preferably initially substantially half the full-scale input signal value of the converter.

The said first, second and third values of the said digital data are, for example, +1, −1 and 0, respectively. These values are convenient to manipulate in digital circuitry.

It would be possible to perform the respective comparisons with the first and second comparison values simultaneously, using separate circuits (for example two DACs and two comparators) to generate the two comparison values, and compare them with the input signal, simultaneously. Although this simultaneous comparison would tend to reduce the time required for each conversion cycle, the two separate circuits would need to be matched appropriately and this would in fact have the effect of increasing the settling time required before valid results of the comparisons could be obtained.

Preferably, therefore, the said comparator means are operable selectively in each conversion cycle to perform a first comparison in which the said input signal value is compared with one of the said first and second comparison values and then to perform a second comparison in which the input signal value is compared with the other of those two comparison values. This can enable the same analog circuits (DAC and comparator) to produce both comparison values, so that no more analog circuitry is required than in the conventional successive-approximation ADC. As no matching of separate circuits is required valid results for each comparison can be obtained desirably quickly.

In this case, in each conversion cycle the said predetermined upward adjustment amount is preferably substantially double the said first predetermined amount and the said predetermined downward adjustment amount is preferably substantially double the said second predetermined amount, and the said first and second predetermined amounts are preferably initially substantially equal to one-eighth of the full-scale input signal value (full-scale scan) of the converter.

Preferably the said comparator means do not perform the said second comparison if the result of the said first comparison makes the second comparison superfluous. For example, if in the first comparison it is found that the input signal value is greater than the first comparison value, then since the first comparison value is greater than the second comparison value it follows that the input signal value cannot be less than the second value. By omitting the second comparison more time is left for settling of the comparator means before commencement of the next conversion cycle. Alternatively, the next cycle could be commenced straight away, for example to reduce the total conversion time or to leave "spare" comparison phases for use in later, more critical, conversion cycles.

In a preferred embodiment the said comparator means select for use in the said first comparison of each conversion cycle that one of the said first and second comparison values which differs most from the comparison value used in the final comparison of the previous conversion cycle. By bringing about the largest possible change in the successive comparison values employed by the comparator means it is made more likely that the trial signal value will cross the input signal value more often during the course of the conversion and hence more likely that correct digital data will be produced in each cycle. Thus, the required settling time of the comparator means can be reduced still further.

It is advantageous for the comparator means to employ in the first comparison of the first conversion cycle that one of the said first and second comparison values which differs most from the said input signal value. This means that in that first comparison the difference between the input voltage and the comparison voltage is largest, increasing the chances of the correct comparison result being obtained even if the comparator means have not settled completely when the result is taken. The selection of the comparison value can be made by performing an initial comparison, before commencement of the first conversion cycle, in which the analog input voltage is compared with half the full-scale analog input voltage of the converter. If the input voltage exceeds half the full-scale input voltage the second (lower) comparison voltage should be selected for use in the first comparison of cycle 1, but otherwise the first (higher) comparison voltage should be selected.

In another preferred embodiment the said comparator means are operable in each conversion cycle to perform a first comparison in which the said input signal value is compared with the said trial signal value and then to perform a second comparison in which the said input signal value is compared with the said first comparison value when the result of the said first comparison is that the input signal value is greater than the trial signal value and is compared with the said second comparison value when the result of the said first comparison is that the input signal value is less than the said trial signal value. In this case, it is preferable that, in each conversion cycle, the said predetermined upward adjustment amount is substantially equal to the said first predetermined amount, and that the said predetermined downward adjustment amount is substantially equal to the said second predetermined amount. The said first and second predetermined amounts are preferably initially substantially equal to one-quarter of the full-scale input signal value of the converter.

In one example, the said successive approximation means include: digital register means for storing the digital data produced by the said comparator means in each cycle; and data processing means connected to the said digital register means for employing the stored digital data to selectively derive digital code data corresponding to one of the said first and second comparison values or to the said trial signal value; and the said comparator means include digital-to-analog conversion means connected to the said data processing means for producing an analog comparison signal corresponding to the digital code data, and an analog comparator for comparing the said analog input signal and the said analog comparison signal to produce the said digital data. In this example the successive approximation means are fully digital and can control the operation of the analog comparator means simply and conveniently.

Preferably, the said data processing means produce the digital code data in the form of Gray codes, and the said digital-to-analog conversion means are responsive to such Gray codes. This can avoid glitches in the analog comparison value when the digital code data is changed and so improves the settling of the comparator means.

According to a second aspect of the present invention there is provided an analog-to-digital converter operable repetitively to perform a series of conversion cycles and including: comparator means connected for receiving an analog input signal and operable in each such conversion cycle to produce digital data that has a first value when the input signal value is greater than a comparison value and that otherwise has a second value, the comparison value being dependent upon a trial signal value determined by the converter for use in the cycle concerned; and successive approximation means operable in each conversion cycle to adjust the said trial signal value in dependence upon the said digital data produced in the cycle concerned so as to tend to bring that value into closer correspondence with the said input signal value; wherein at least one conversion cycle of the said series is a correction cycle in which the comparator means are operated more than once so that respective first and second comparisons are performed in the correction cycle, and the said successive approximation means are operable in the correction cycle to employ the digital data produced respectively by the first and second comparisons when adjusting the said trial signal value.

Such an ADC can also provide substantial improvements in speed over a conventional successive-approximation ADC without requiring any increase in the performance levels (settling time and comparison accuracy) of the comparator means (analog circuits). The determination of the trial signal value is self-correcting, within reasonable limits, so that any errors in the digital data produced in one conversion cycle due to incomplete settling and/or inaccuracy of the comparison are corrected automatically in later cycles. This allows the comparator means to be operated faster than in a conventional successive-approximation ADC.

The said comparison value employed in the said second comparison of the said correction cycle is preferably dependent upon the said digital data produced by the first comparison.

Preferably, in the said correction cycle the successive approximation means determine n bits of the trial signal value, where n is an integer greater than or equal to 1, and the said comparator means perform m comparisons, where m is an integer greater than n.

Every conversion cycle of the series may be a correction cycle or alternatively there may be just one correction cycle in total or one correction cycle per plural number of conversion cycles.

According to a third aspect of the present invention there is provided an analog-to-digital conversion method, for producing a digital signal that corresponds to an analog input signal, including a series of conversion cycles, each conversion cycle comprising the steps of: producing digital data that has a first value when the input signal value is greater than a first comparison value and that has a second value when the said input signal value is less than a second comparison value and that in all other cases has a third value, the said first comparison value being greater than a trial signal value determined for use in the cycle concerned and differing from that trial signal value by a first predetermined amount, and the said second comparison value being less than the said trial signal value and differing therefrom by a second predetermined amount; and adjusting the said trial signal value in dependence upon the said digital data produced in the cycle concerned so as to tend to bring that value into closer correspondence with the said input signal value.

According to a fourth aspect of the present invention there is provided an analog-to-digital conversion method, for producing a digital signal that corresponds to an analog input signal, including a series of conversion cycles, each conversion cycle comprising the steps of: making a comparison between the input signal value and a comparison value and producing digital data that has a first value when the input signal value is greater than the comparison value and that otherwise has a second value, the comparison value being dependent upon a trial signal value determined for use in the cycle concerned; and adjusting the said trial signal value in dependence upon the said digital data produced in the cycle concerned so as to tend to bring that value into closer correspondence with the said input signal value; wherein at least one conversion cycle is a correction cycle in which respective first and second such comparisons are made and in which the digital data produced respectively by the first and second comparisons is employed when adjusting the said trial signal value.

BRIEF DESCRIPTION OF THE DRAWINGS

FIG. 6 shows a table for use in explaining operation of the first embodiment;

FIG. 9 shows a table for use in explaining operation of the second embodiment;

FIG. 18A shows a diagram for use in explaining operation of an ADC employing a conventional binary search algorithm; and FIGS. 18B and 18C show respective diagrams corresponding to FIG. 13A for use in explaining operation of fifth and sixth embodiments of the present invention.

DETAILED DESCRIPTION OF THE PREFERRED EMBODIMENTS

Figure 1:
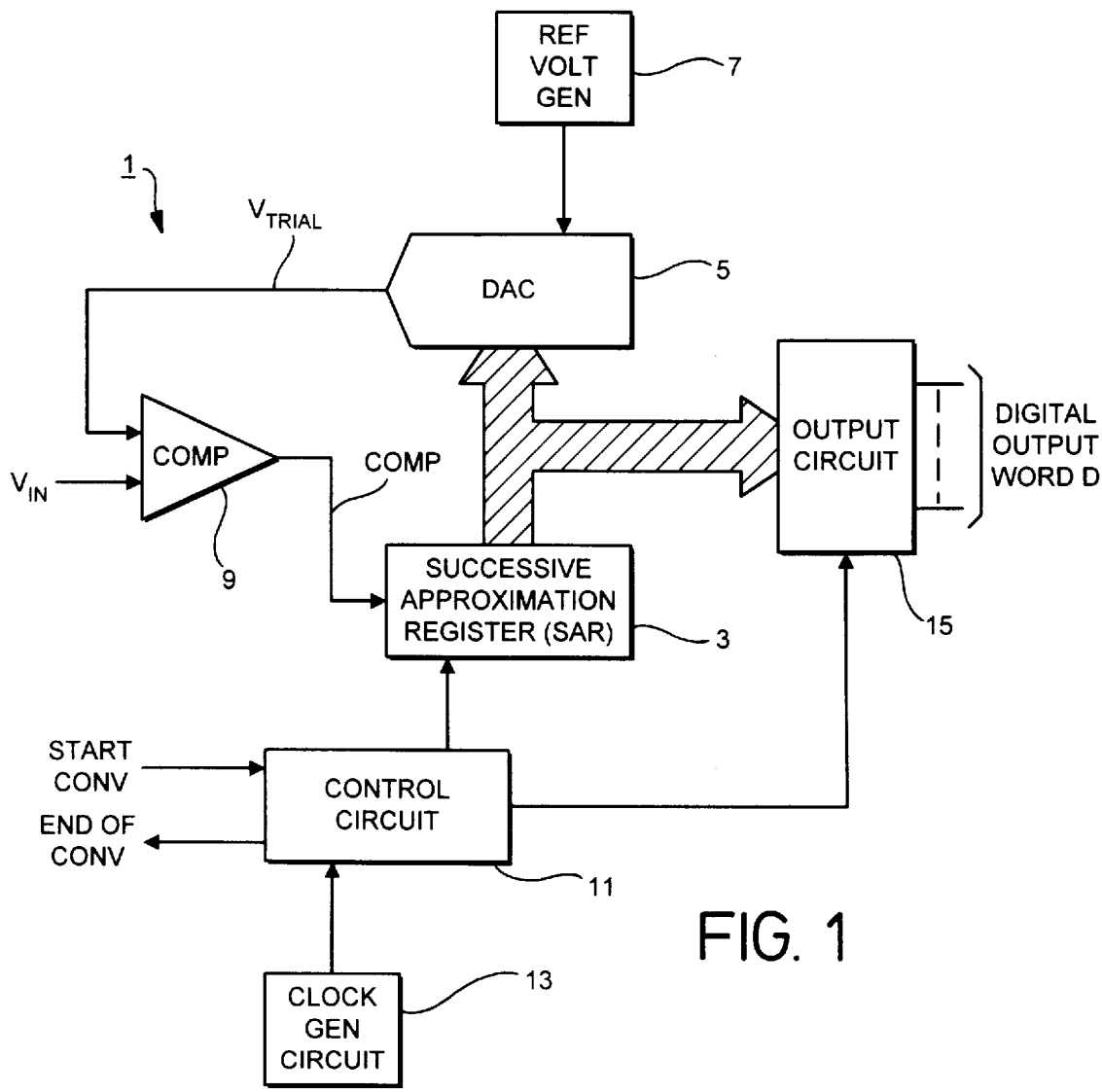
FIG. 1, discussed hereinbefore, shows a schematic block diagram of a conventional successive-approximation analog-to-digital converter.
Figure 2:
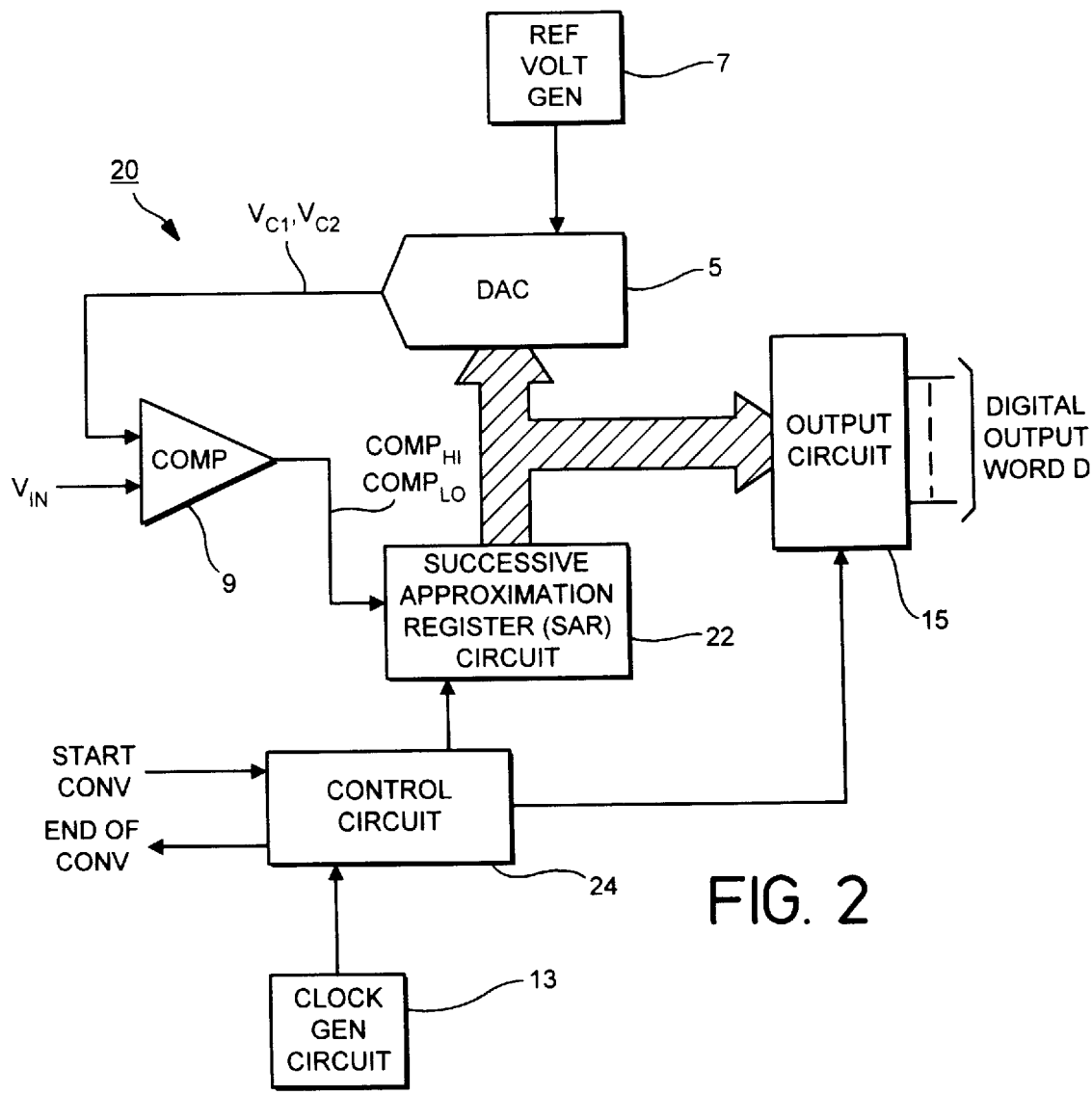
FIG. 2 shows a schematic block diagram of an analog-to-digital converter according to a first embodiment of the present invention.

A successive-approximation ADC according to a first embodiment of the present invention is shown in FIG. 2. The ADC 20 of the first embodiment has a similar construction to that of the ADC 1 of FIG. 1, and the same components in the two Figures are denoted by the same reference numerals. In the ADC 20 of the first embodiment, however, the successive-approximation register circuitry (SAR) 22 and the control circuit 24 are each different from the corresponding circuits 3 and 11 in FIG. 1.

The ADC of the first embodiment is, like the FIG. 1 ADC, a successive-approximation ADC, but operates according to a different conversion algorithm.

In the first embodiment, instead of setting one bit of the successive approximation register to 1 or 0 in each cycle in dependence upon the outcome of a comparison between a single trial voltage $V_{TRIAL}$ and the analog input voltage $V_{IN}$ to be converted, each bit of the SAR 22 can be set to one of three different digital values, for example +1, −1, and 0, in dependence upon the result of the comparison of the analog input voltage $V_{IN}$ with two different comparison voltages $V_{C1}$, and $V_{C2}$. One of these comparison voltages $V_{C1}$ exceeds the current "trial" voltage $V_{TRIAL}$ by a first amount $\Delta V_1$, and the other of the two comparison voltages $V_{C2}$ is less than that trial voltage $V_{TRIAL}$ by a second amount $\Delta V_2$. The trial voltage is then selectively adjusted (increased by an upward adjustment value $V_{ADJ1}$ or decreased by a downward adjustment value $V_{ADJ2}$) at the end of each conversion cycle in dependence upon the results of the comparison between the input voltage $V_{IN}$ and the two comparison voltages $V_{C1}$ and $V_{C2}$.

Table 1 below shows the operations performed in each conversion cycle of the first embodiment, assuming the digital decision values for each "bit" of the SAR to be +1, −1, and 0.

TABLE 1

| Comparison | Digital Output Signal | Trial Voltage Adjustment |
| --- | --- | --- |
| $V_{IN} > V_{TRIAL} + \Delta V_1$ | +1 | $V_{TRIAL} \leftarrow V_{TRIAL} + V_{ADJ1}$ |
| $V_{IN} < V_{TRIAL} - \Delta V_2$ | −1 | $V_{TRIAL} \leftarrow V_{TRIAL} - V_{ADJ2}$ |
| $V_{TRIAL} - \Delta V_2 \leq V_{IN} \leq V_{TRIAL} + \Delta V_1$ | 0 | No change |

Preferably, in the first embodiment of the present invention, the respective differences $\Delta V_1$ and $\Delta V_2$ between, on the one hand, the comparison voltages $V_{C1}$ and $V_{C2}$, and, on the other hand, the trial voltage $V_{TRIAL}$ are made equal in each cycle, i.e. $\Delta V_1 = \Delta V_2 = \Delta V$. In this embodiment, the upward and downward adjustment values $V_{ADJ1}$ and $V_{ADJ2}$ are also made equal in each cycle, i.e. $V_{ADJ1} = V_{ADJ2} = V_{ADJ} = 2 \times \Delta V$. In successive cycles, the $\Delta V$ and $V_{ADJ}$ values are halved as compared to those used in the previous cycle.

Table 2 below illustrates exemplary values of $\Delta V$ and $V_{ADJ}$ used in successive cycles for a 16 bit ADC in which the internal DAC 5 has a full-scale output voltage value $V_{fsc}$.

TABLE 2

| CYCLE | $\Delta V/V_{fsc}$ | $V_{ADJ}/V_{fsc}$ |
| --- | --- | --- |
| 1 | 1/8 | 1/4 |
| 2 | 1/16 | 1/8 |
| 3 | 1/32 | 1/16 |
| 4 | 1/64 | 1/32 |
| 5 | 1/128 | 1/64 |

TABLE 2-continued

| CYCLE | $\Delta V/V_{fsc}$ | $V_{ADJ}/V_{fsc}$ |
| --- | --- | --- |
| 6 | 1/256 | 1/128 |
| 7 | 1/512 | 1/256 |
| 8 | 1/1024 | 1/512 |
| 9 | 1/2048 | 1/1024 |
| 10 | 1/4096 | 1/2048 |
| 11 | 1/8192 | 1/4096 |
| 12 | 1/16384 | 1/8192 |
| 13 | 1/32768 | 1/16384 |
| 14 | 1/65536 | 1/32768 |
| 15 | $(2^{-17})$ | $(1/65536)$ |
| 16 | $(2^{-18})$ | $(2^{-17})$ |

In the final two cycles of the conversion (cycles 15 and 16 in Table 2) the algorithm cannot be used because the required values of $\Delta V/V_{fsc}$ and $V_{ADJ}/V_{fsc}$ in these cycles ($2^{-17}$ and $2^{-18}$) are too small to express digitally (less than 1 LSB) at the input of the DAC 5. For this reason, a different algorithm is used in cycles 15 and 16, as will be described later with reference to FIG. 6.

As in the conventional ADC of FIG. 1, the initial trial voltage $V_{TRIAL}$ (trial voltage for use in cycle 1) is chosen to be half the full-scale output voltage value $V_{fsc}$ of the DAC 5.

Simulations have demonstrated that the use of the above conversion algorithm in a successive-approximation ADC can provide significant increases in the conversion speed whilst employing the same analog circuits (DAC 5 and comparator 9) as the conventional successive-approximation ADC of FIG. 1.

Figure 3:
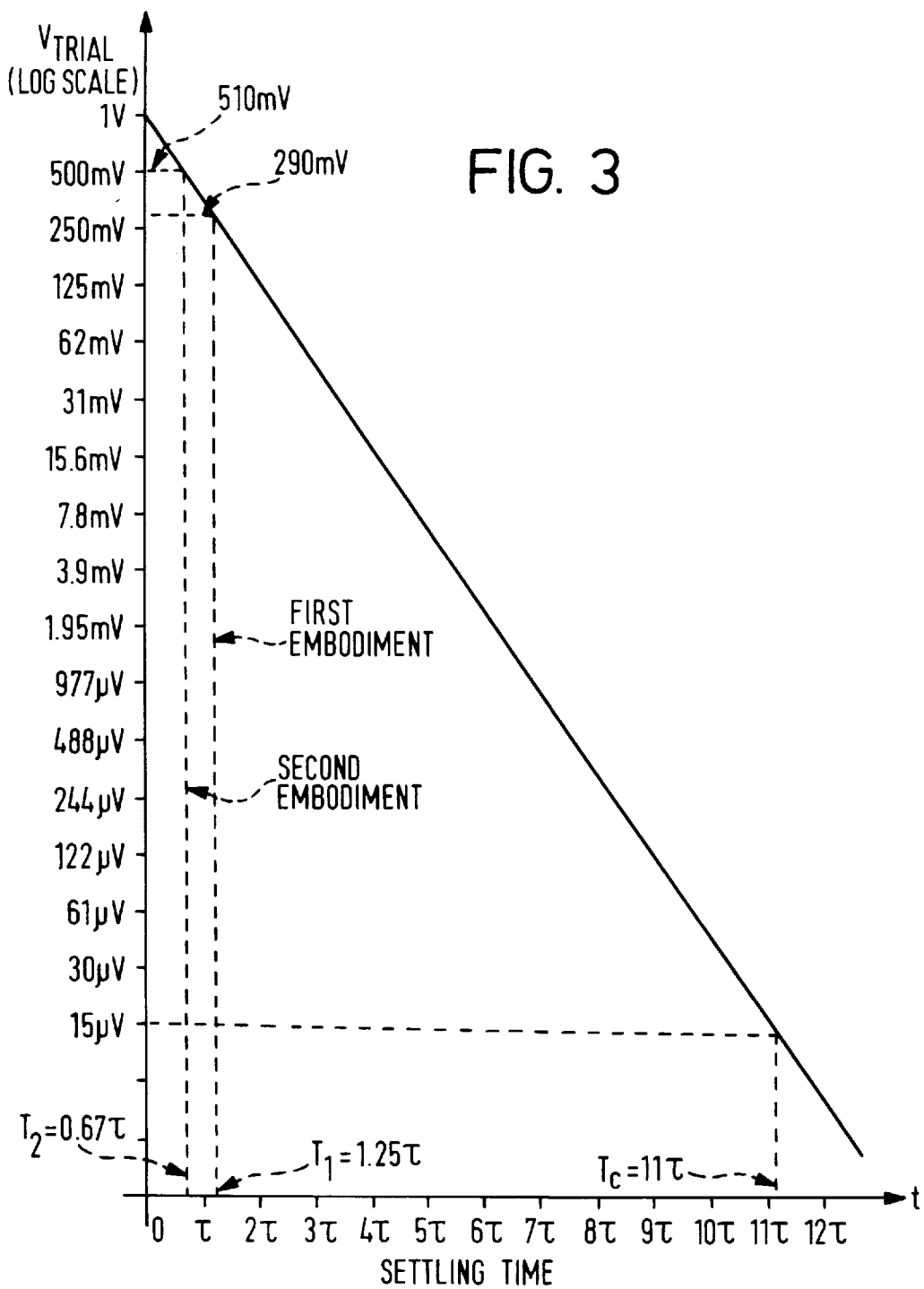
FIG. 3 shows a graph for use in comparing operation of the conventional ADC of FIG. 1 and the first embodiment.

In a conventional 16-bit successive-approximation ADC having a two-volt full-scale value $V_{fsc}$ and a differential non-linearity (DNL) of 0.5 (signifying that when the input code of the DAC 5 is changed by 1 LSB, the analog output voltage of the DAC changes by an amount that is equivalent to between 0.5 and 1.5 LSB) the internal analog circuits of the ADC (the DAC 5, the comparator 9, and even the reference voltage generating circuit 7 which tends to produce small but significant changes in the reference voltage it supplies to the DAC 5 when the input code of the DAC changes) require up to 11 time constants to settle to 16-bit accuracy prior to the comparison performed in each successive-approximation cycle, and the comparator 9 must make a correct decision to within 15 $\mu V$ after up to 1 volt initial overdrive (1 volt being the maximum step change in the trial voltage $V_{TRIAL}$). This settling is illustrated in FIG. 3, which assumes an exponential decay, starting from 1 V, of the trial voltage $V_{TRIAL}$ applied to the comparator 9. The time axis is labelled in units of $\tau$, where $\tau$ is the time taken for the trial voltage $V_{TRIAL}$ to decay to 1/e (0.37 V) of its initial value.

Simulations employing the "three-state" conversion algorithm of the first embodiment have indicated that the first embodiment can achieve the same results as the conventional FIG. 1 ADC whilst requiring significantly lower levels of performance from the analog circuits. In particular, the requirements for analog circuit settling accuracy and comparator decision accuracy have been found to be much less strict in the first embodiment using the "three-state" algorithm, enabling sufficient settling for an accurate final output value to be achieved in just 1.25$\tau$ (as compared to 11$\tau$ in the FIG. 1 ADC). In other words, in the first embodiment the time $T_1$ required to perform the comparison is only 1.25 times the settling time constant $\tau$ of the analog circuits, i.e. $T_1 = 1.25\tau$, whereas in the conventional ADC of FIG. 1 it is $T_c=11\tau$. For example, the decision for the most significant bit (i.e. the comparison performed in the first successive-approximation cycle having a step size of 1 V) needs to be correct to within only 290 mV (see FIG. 3), the next decision to within 145 mV and so on. Any errors that arise due to this incomplete settling (i.e. settling to within only 290 mV in the first cycle instead of 15 $\Delta V$ as required in the conventional ADC) are automatically corrected in the following conversion cycles. In other words, if errors are made in the decision in a particular cycle (due to inadequate settling of the DAC and/or comparator, for example) then it is possible (within limits such as those identified above) to correct these errors in later cycles, because the same final output code can be reached by more than one route.

It has been found that this automatic correction works whatever the final accuracy required at the end of the conversion, so that the minimum settling time does not increase with higher converter resolutions.

It will be appreciated that when using the three-state algorithm two comparisons may be required in each conversion cycle instead of just one as in the conventional FIG. 1 ADC. However, the overall conversion rate is still increased in the first embodiment by 2 to 4 times (depending on the resolution and the characteristics of the analog circuits) because the analog circuits can be operated between 4 and 8 times faster than in the FIG. 1 ADC. Thus, for example, whereas the FIG. 1 ADC would need 16×0.8 $\mu$s (estimated) clock periods for a conversion, the ADC of the first embodiment requires 32×0.1 $\mu$s clock cycles. Including the time required to acquire an input sample (0.8 $\mu$s), the first embodiment decreases the conversion time from 13.6 $\mu$s to 4.0 $\mu$s (corresponding to an increase in the conversion rate from 73.5 kHz to 250 kHz).

Figure 4:
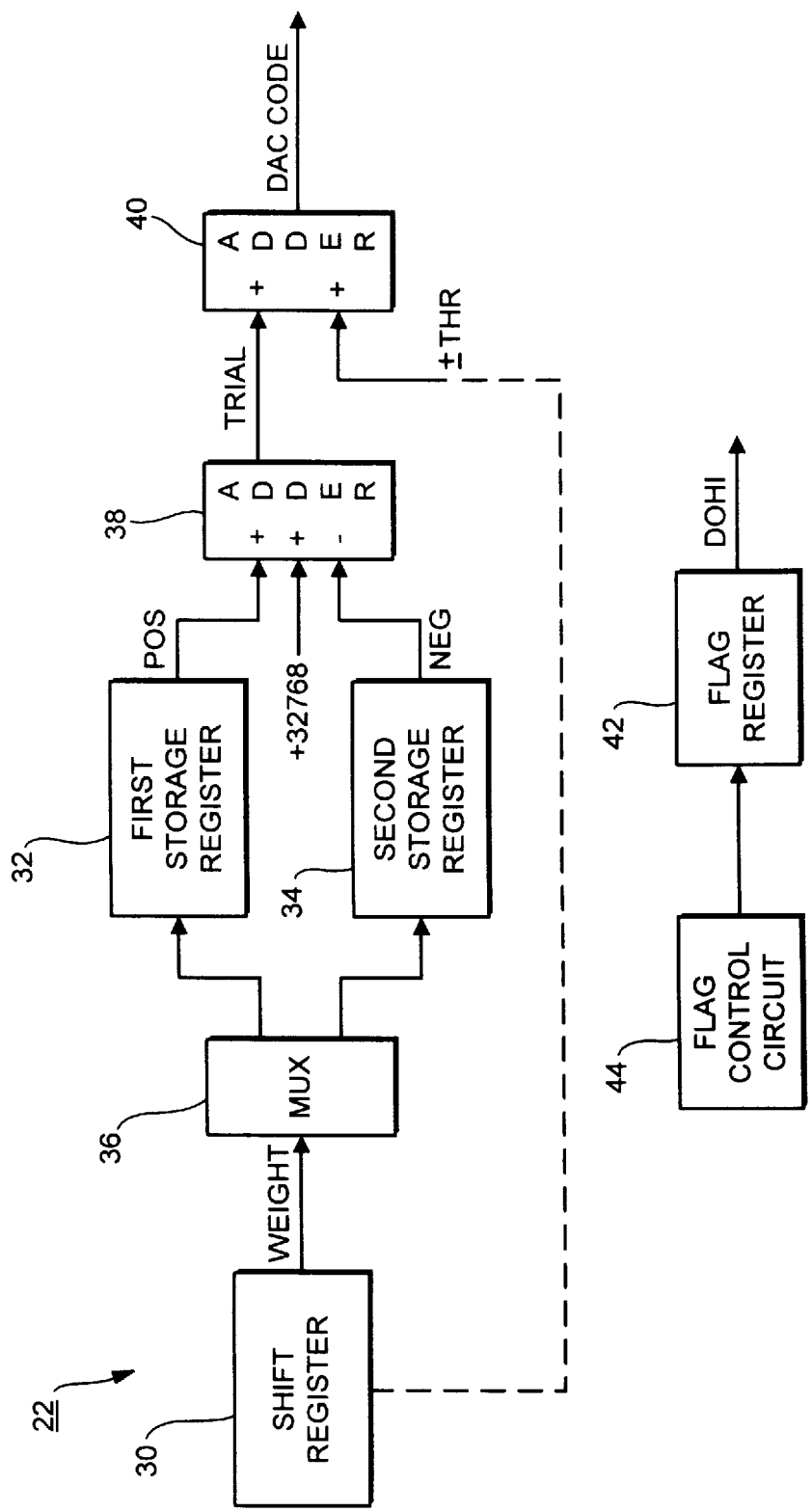
FIG. 4 shows an example of the construction of successive approximation register circuitry included in the first embodiment.

A schematic block diagram of an example of the successive-approximation register circuitry 22 of the first embodiment ADC is shown in FIG. 4. The SAR circuitry 22 includes a 15 bit shift register 30, first and second storage registers 32 and 34, a multiplexer 36 and first and second adders 38 and 40. The SAR circuitry 22 also includes a single-bit flag register 42 and an associated flag control circuit 44.

Operation of the successive approximation register circuitry 22 of FIG. 4 will now be described. The shift register 30 is used to store a digital value WEIGHT corresponding to the aforementioned analog adjustment amount $V_{ADJ}$. The first and second storage registers 32 and 34 are used to store respective digital values POS and NEG that are employed to determine the current trial voltage $V_{TRIAL}$. The flag register 42 stores a flag DOHI, the purpose of which will be explained later. The setting/resetting of the DOHI flag is carried out by the associated flag control circuit 44.

The adder 38 receives at different inputs thereof the digital values POS and NEG stored respectively in the first and second storage registers 32 and 34, and a further constant digital value +32768 ($=2^{15}$). Thus, the digital value TRIAL produced at the output of the adder 38 is equal to 32768+POS−NEG. The adder 40 receives the digital value TRIAL at one input thereof, and receives one of two further digital values±THR at its other input. These digital values correspond to $\pm\Delta V$ mentioned above. The value +THR is applied to the adder 40 when the flag DOHI stored in the flag register 42 is set (=1) and the value −THR is applied to the adder 40 when the flag DOHI is reset (=0).

It will be seen in FIG. 4 that the adder 40 and shift register 30 are shown linked by a dotted line. This is intended to show that the two values±THR can be derived from the value WEIGHT held in the shift register 30. For example, when as in the example given above $V_{ADJ}=2\Delta V$, $\pm$THR= $\pm$WEIGHT/2.

The output of the adder 40 can accordingly be set to TRIAL+THR or TRIAL−THR depending on the flag DOHI. These two digital values correspond respectively to the two comparison voltages $V_{C1}$ and $V_{C2}$ mentioned above.

The multiplexer 36 of the FIG. 4 circuitry enables the WEIGHT value held in the shift register 30 to be added either to the content POS of the first storage register 32 or to the content NEG of the second shift register 34. These addition operations are required at the end of a conversion cycle, as will be explained hereinafter.

Figure 5A:
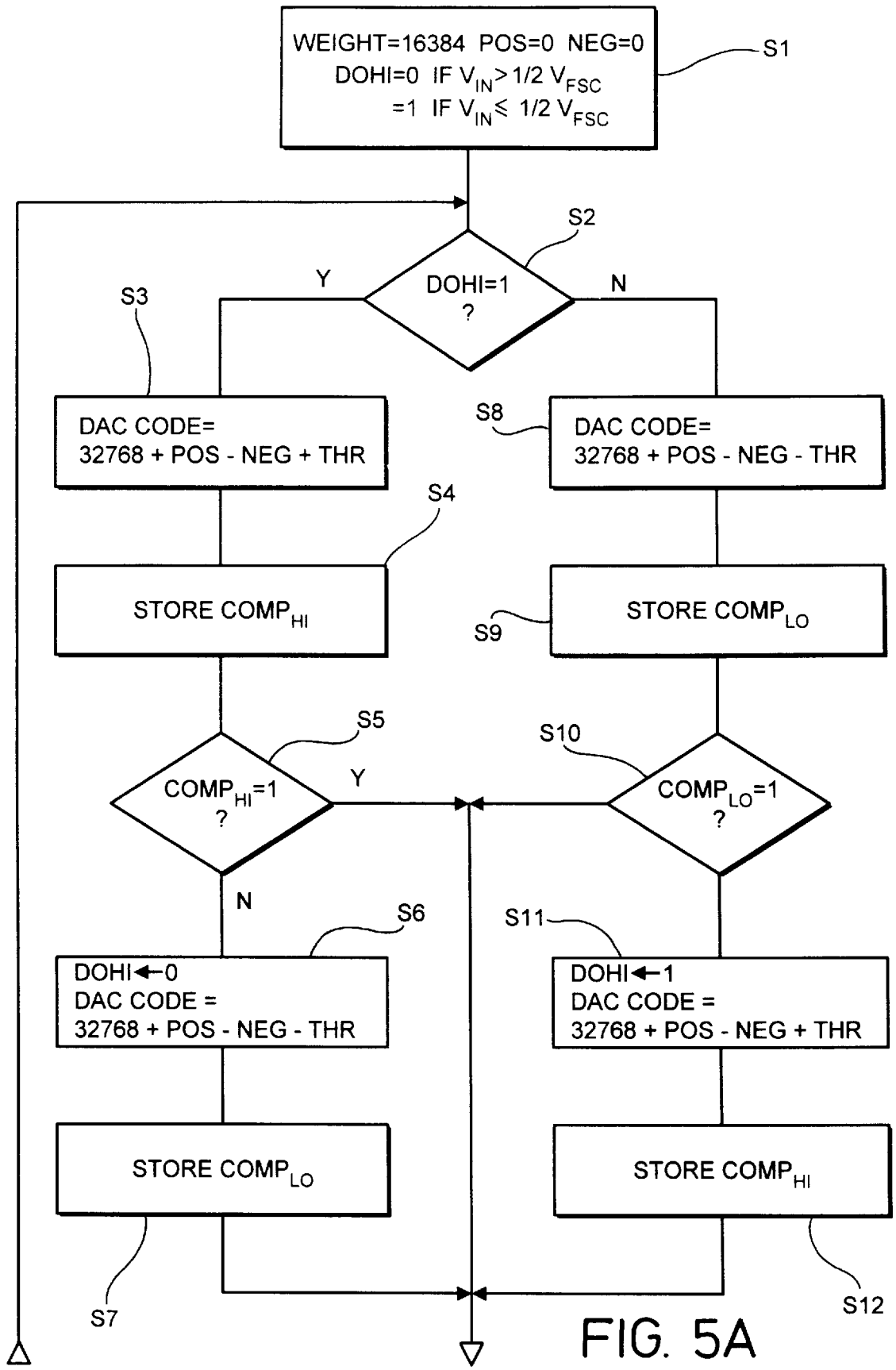
FIGS. 5A and 5B show a flowchart for use in explaining operation of the first embodiment.
Figure 5B:
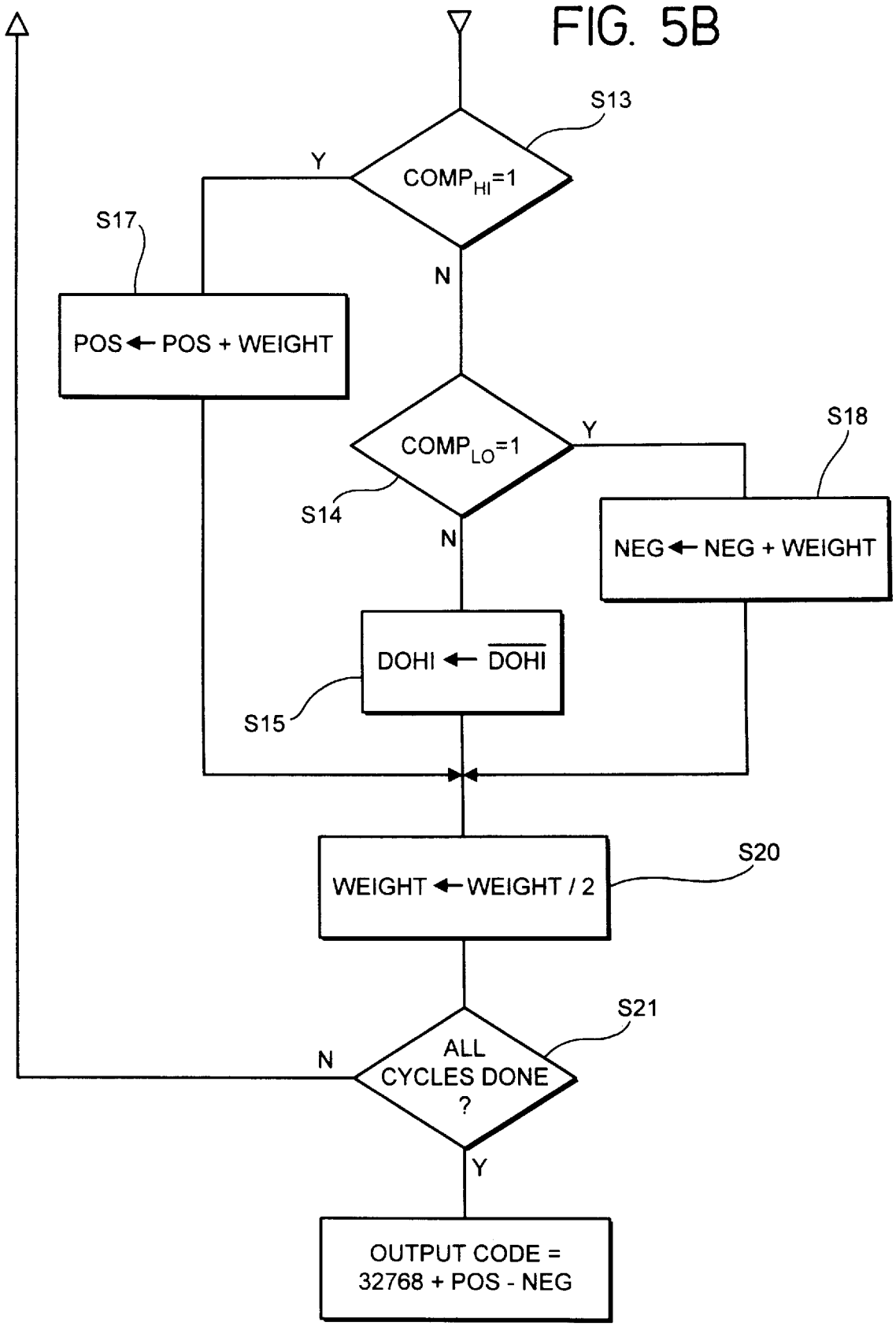

Referring now to FIGS. 5A and 5B, operation of the first embodiment will now be explained.

In an initialisation step S1, the contents of the registers are set by the control circuit 24 of the ADC to their respective initial values as follows:

WEIGHT=16384 ($2^{14}$), POS=0, NEG=0.

In between conversions, the input code of the DAC is set to mid-code, i.e. 32768, so that the DAC output voltage is $V_{fsc}/2$. Because the input voltage $V_{IN}$ is applied to the comparator 9 between conversions, passing through a track-and-hold circuit which at that time is in the tracking state, it is possible to select the initial value of DOHI for use in the first cycle of the next conversion, based on a comparison between $V_{IN}$ and $V_{fsc}/2$ performed by the comparator immediately before the start of cycle 1. DOHI is set to 1 if the result of the comparison is that $V_{IN} \leq V_{fsc}/2$, and to 0 if $V_{IN} > V_{fsc}/2$. The reason for this initial selection of the value of the DOHI flag will be explained hereinafter.

In step S2, the first conversion cycle commences and it is determined whether or not the flag DOHI is set. When the DOHI flag is set at the beginning of a cycle, this signifies that the first comparison to be performed in the cycle is the comparison with the higher comparison voltage $V_{C1}$. When the flag DOHI is reset (i.e. has the value 0) at the beginning of the cycle, this signifies that the first comparison to be performed in the cycle is the comparison with the lower comparison voltage $VC_2$.

Thus, if DOHI is set initially, the processing continues at step S3 in which the digital input code of the DAC 5 (DAC code) is set by the SAR circuitry 22 to 32768+POS−NEG+THR. Since POS and NEG are initially both zero, this results in the DAC code being set to 32768+8192=40960 (40k). As a result the analog output voltage of the DAC 5 changes to the higher comparison voltage $V_{C1}$ which, in this case, is the analog equivalent to the digital value 40k. After sufficient time has elapsed for the DAC 5 and comparator 9 to settle to the required extent (for example the time $T_1=1.25\tau$ as indicated above), the result COMP$_{HI}$ is stored (COMP$_{HI}$=1 if $V_{IN} > V_{C1}$, otherwise COMP$_{HI}$=0) at step S4. Then in the step S5 it is determined whether or not it is necessary to carry out a second comparison with the lower comparison voltage $V_{C2}$. Such a comparison is only necessary if the result COMP$_{HI}$ of the first comparison is zero ($V_{IN} \leq V_{C1}$). If the second comparison is necessary, processing proceeds to step S6 where DOHI is changed to zero by the flag control circuit 44 so that the DAC code is changed to 32768+POS−NEG−THR, which in the first conversion cycle is equal to 32768−8192=24576 (24k). After the required settling time has elapsed the result of the second comparison COMP$_{LO}$ (COMP$_{LO}$=1 if $V_{IN} < V_{C2}$, otherwise COMP$_{LO}$=0) is obtained and stored (step S7).

If in step S2 the flag DOHI was found to be zero initially, the comparisons are performed in the reverse order, i.e. the lower comparison voltage $V_{C2}$ is generated first (step S8) and its result $COMP_{LO}$ stored (step S9), it is determined in dependence upon the result $COMP_{LO}$ of the first comparison whether or not the second comparison is required (step S10) and, if so, DOHI is changed to 1 by the flag control circuit 44 so that the higher comparison voltage $V_{C1}$ is generated (step S11) and the result $COMP_{HI}$ obtained and stored (step S12).

Processing then passes to step S13 in which the result $COMP_{HI}$ of the comparison with the higher comparison voltage $V_{C1}$ is tested. If $COMP_{HI}=1$, POS is increased by WEIGHT (step S17). In this case the control circuit 24 causes the multiplexer 36 to apply the value WEIGHT to the first storage register 32 for addition to the value POS held therein. Processing then continues at step S20.

If in step S13 $COMP_{HI}$ is found to be zero, processing continues at step S14 at which the result $COMP_{LO}$ of the other comparison is tested. If $COMP_{LO}$ is found to be 1, NEG is increased by WEIGHT (step S18). In this case the control circuit 24 causes the multiplexer 36 to apply the value WEIGHT to the second storage register 34 for addition to the value NEG held therein. Processing then continues at step S20.

If $COMP_{HI}$ and $COMP_{LO}$ are both zero, processing reaches step S15 at which the flag DOHI is inverted by the flag control circuit 44. The reason for changing DOHI in this way will be explained hereinafter.

In step S20 the value WEIGHT is halved (accomplished by shifting the content of the shift register 30 one place to the right). Then in step S21 it is determined whether all of the conversion cycles have yet been completed. If not, processing returns to step S2 for the start of the next cycle. If it is determined in step S21 that all of the conversion cycles have been completed, the result OUTPUT of the conversion is calculated as 32768+POS−NEG, and this result is output by the converter.

Next, a specific example of the operation of a 16-bit version of the ADC according to the first embodiment will be given with reference to FIG. 6. In the example of FIG. 6, the analog input voltage $V_{IN}$ to be converted is 1.2933 V, which has a corresponding digital value of 42379.4 (=41.386k). Since $V_{IN}>V_{fsc}/2$, DOHI is set to zero in the initialisation step S1. Thus, as shown in the Figure, in cycle 1 the first comparison performed is that with the lower comparison voltage $V_{C2}$ which is equivalent to the digital value 24576. The result $COMP_{LO}$ of this comparison is 0 (i.e. $V_{IN}>V_{C2}$) and so it is necessary to carry out the second comparison in this cycle. For this second comparison the higher comparison voltage $V_{C1}$ is used, this higher comparison voltage being equivalent to 40960. The result $COMP_{HI}$ of this comparison is 1 ($V_{IN}>V_{C1}$) and so, based on the combination of the results $COMP_{LO}$ and $COMP_{HI}$, POS is increased by 16384, WEIGHT is halved to 8192, and the next conversion cycle commences.

In cycle 2, the comparison with the higher of the two comparison voltages is performed first (DOHI=1 at the end of cycle 1), the higher comparison voltage $V_{C1}$ being equivalent to 54248. The result $COMP_{HI}$ of this comparison being 0 ($V_{IN}<V_{C1}$), the comparison with the lower comparison voltage $V_{C2}$ is required. This lower comparison voltage $V_{C2}$ is set to 45056 and the result $COMP_{LO}$ is 1 ($V_{C2} \geq V_{IN}$). With this combination of results $COMP_{HI}$ and $COMP_{LO}$, NEG is increased by WEIGHT (8192) and, after halving WEIGHT once more, the next cycle (cycle 3) commences.

In cycle 3, the higher comparison is performed first (DOHI=0 at the end of cycle 2), $V_{C2}$ being equivalent to the digital value 38912, and the result $COMP_{LO}$ of the comparison is zero. Accordingly the second comparison is required, $V_{C1}$ being equivalent to the digital value 43008. The result $COMP_{HI}$ of this comparison is also zero. As a result, neither POS nor NEG is changed, but DOHI is changed at the end of the cycle from 1 back to zero. WEIGHT is halved again to 2048.

In cycle 4, because DOHI=0 initially, the first comparison to be performed is that with the lower comparison voltage $VC_2$. This lower comparison voltage $V_{C2}$ is set to 39936, and the result $COMP_{LO}$ of the comparison is zero. This result $COMP_{LO}$ being zero, the comparison with the higher comparison voltage $V_{C1}$ is required, $V_{C1}$ being equivalent to the digital value 41984. The result $COMP_{HI}$ of this second comparison is 1, and accordingly POS is increased to 18432 (16384+2048). Processing continues in this way until the end of cycle 14.

The last two bits of the output code are not produced using the three-state algorithm, because the threshold values would have to be less than 1. Instead, the values for the last two bits of the output code are produced as follows.

In cycle 15, the DAC code is set to 32768+POS−NEG to produce a trial voltage $V_{TRIAL}$ corresponding to 32768+POS−NEG and then comparison of the trial voltage $V_{TRIAL}$ with the input voltage $V_{IN}$ is performed. If the result is 1 ($V_{IN}>V_{TRIAL}$) POS is increased by 1 (to set a higher value of $V_{TRIAL}$ for cycle 16); otherwise NEG is increased by 1 (to set a lower value of $V_{TRIAL}$ for cycle 16). In the example of FIG. 6, in cycle 15, a DAC code of 42380 is used to produce the trial voltage, i.e. $V_{TRIAL}$ corresponds to the digital value 42380. Since $V_{IN}<V_{TRIAL}$ the result of the comparison is zero and so NEG is increased by 1.

In cycle 16, the DAC code is set to 32768+POS−NEG to produce a final trial voltage $V_{TRIAL}$ corresponding to 32768+POS−NEG and then comparison of this final trial voltage with the input voltage $V_{IN}$ is performed. In this case, if the result is 1 ($V_{IN}>V_{TRIAL}$) no change to POS or NEG is made; otherwise NEG is increased by 1.

The final decision of the conversion process should apply ±½ bit, but this is not possible. Instead, NEG is either increased by 1 or not, depending upon the result of the comparison performed, resulting in a ½ LSB offset. In the example of FIG. 6, in cycle 16, a DAC code of 42379 is used to produce the final trial voltage, i.e. $V_{TRIAL}$ corresponds to the digital value 42379. Since $V_{IN}>V_{TRIAL}$ the result of the comparison is 1 and so no change is made to NEG.

Accordingly, at the end of cycle 16 in the example of FIG. 6, POS=18964, NEG=9353, so that the result OUTPUT of the conversion process is equal to 32768+18964−9353=42379, which is the intended result.

Since the final two cycles 15 and 16 only require one comparison, the complete conversion requires 30 clock cycles, there being one comparison per clock cycle.

It will be seen from the flowchart of FIGS. 5A and 5B, and the example given with reference to FIG. 6, that the flag DOHI is used to determine which comparison is performed first in any given cycle.

The DOHI flag is controlled at the end of each cycle so that, at the start of the next cycle, the first comparison voltage to be produced is the one which requires the larger change in the DAC output voltage. For example, in the example of FIG. 6, the flag DOHI is left at 1 at the end of cycle 1 (because only the first comparison was performed), and accordingly the higher comparison voltage (equivalent to 54248) is used in the first comparison of cycle 2, resulting in a larger step change in the DAC output voltage (equivalent to 54248−40960=13288) than would be required had the comparison with the lower comparison voltage (equivalent to 45056) been performed first.

When both comparisons are performed in a particular cycle and the result of the second comparison is 1, the sequence of comparisons in the next cycle is reversed, see for example cycles 2 and 3 in the example of FIG. 6. Again, this is intended to ensure that the change in DAC output voltage required at the start of each new cycle is maximised. For example, the step change required at the start of cycle 3 is 45056−38912, which is significantly higher than 45056−43008 which would be the change involved had the higher comparison voltage been tried first in cycle 3.

In the case in which two comparisons are required in a particular cycle and the result of the comparisons is that $V_{IN}$ is between the higher and lower comparison voltages, DOHI is inverted at the end of the cycle (step S15 in FIG. 5B) to ensure that at the start of the next cycle the larger of the two possible step changes in the DAC output voltage occurs. For example in cycle 3, DOHI is set when it is determined that the second comparison is required, but is reset in the step S15 so that at the beginning of cycle 4 the larger of the two possible step changes (43008−39936, instead of 43008−41984) is performed.

It was also found preferable to select DOHI for the first cycle so that DOHI=1 when $V_{IN}<V_{fsc}/2$ and DOHI=0 when $V_{IN}>V_{fsc}/2$. This means that in the first comparison of cycle 1 the difference between the comparison voltage and $V_{IN}$ is larger than that difference in the second comparison.

Simulations have shown that using the DOHI flag to ensure that the "largest step" is performed first in a cycle provides a significant improvement in speed. For comparison purposes, the algorithm was modified so that the smallest step was taken first in each cycle. This required the time constant $\tau$ of the analog circuits to be significantly better, namely around 60 ns when the time $T_1$ allowed for each comparison is 100 ns, as compared with the 80 ns time constant with which the "largest step" version of the algorithm can operate satisfactorily.

By manipulating DOHI so that the larger step change is selected wherever possible, it is made more likely that the DAC output voltage will cross the analog input voltage $V_{IN}$, increasing the likelihood of a correct decision being made.

Control of the DOHI flag 42 is carried out by the flag control circuit 44 of the SAR circuitry 22 of FIG. 4. This control circuit 44 receives as inputs the comparison results $COMP_{HI}$ and $COMP_{LO}$ and processes them to determine whether the flag DOHI needs to be changed (steps S6, S11 and S15 in the flowchart of FIG. 5A and 5B). The flag control circuit 44 also sets the initial value of DOHI for use in cycle 1 (step 1 in FIG. 5A) based on the comparison of $V_{IN}$ with $V_{fsc}2$.

It will be understood that it is not essential to select the order of the comparisons. It would be satisfactory in many applications to always carry out the higher comparison first and then the lower one, or vice versa.

A second embodiment of the present invention will now be described with reference to Tables 3 and 4 below. The second embodiment operates basically in the same way as the first embodiment. In particular, in general accordance with Table 1 above, the second embodiment produces digital data having one of three different possible values in each conversion cycle, and the trial voltage $V_{TRIAL}$ is selectively adjusted in the same way according to the digital data produced. However, as shown in Table 3 the comparisons performed in each cycle are different from those performed in the first embodiment.

TABLE 3

| 1st Comp | 2nd Comp | | Digital Output | Trial Voltage |
|---|---|---|---|---|
| $COMP_{TRIAL}$ | $COMP_{HI}$ | $COMP_{LO}$ | Signal | Adjustment |
| 1 | 1 | — | +1 | $V_{TRIAL} \leftarrow V_{TRIAL} + V_{ADJ1}$ |
| 0 | — | 1 | −1 | $V_{TRIAL} \leftarrow V_{TRIAL} − V_{ADJ2}$ |
| 1 | 0 | — | 0 | No |
| 0 | — | 0 | | Change |

In the second embodiment (Table 3) each conversion cycle has two comparison operations. In the first comparison operation the input voltage $V_{IN}$ is compared directly with the trial voltage $V_{TRIAL}$.

If the result $COMP_{TRIAL}$ of the first comparison is 1, signifying that $V_{IN}>V_{TRIAL}$, then in the second comparison operation the input voltage $V_{IN}$ is compared with the higher comparison voltage $V_{C1}$ (=$V_{TRIAL}+\Delta V_1$). If the result $COMP_{HI}$ of this comparison is 1, i.e. $V_{IN}>V_{C1}$, then the digital decision data is set to "+1". Otherwise, the digital decision data is set to "0".

If the result $COMP_{TRIAL}$ of the first comparison is "0", signifying that $V_{IN} \leq V_{TRIAL}$, then in the second comparison operation the input voltage $V_{IN}$ is compared with the lower comparison voltage $V_{C2}$ (=$V_{TRIAL}-\Delta V_2$). If the result $COMP_{LO}$ of this comparison is 1, i.e. $V_{IN<VC2}$, then the digital decision data is set to "−1". Otherwise, the digital decision data is set to "0". At the end of the cycle, the trial voltage $V_{TRIAL}$ is adjusted as before, namely increased by the upward adjustment value $V_{ADJ1}$ if the digital decision data is "+1", decreased by the downward adjustment value $V_{ADJ2}$ if the data is "−1", and left unchanged if the data is "0".

Preferably, as in the first embodiment, the respective differences $\Delta V_1$ and $\Delta V_2$ between, on the one hand, the comparison voltages $V_{C1}$ and $V_{C2}$ and, on the other hand, the trial voltage $V_{TRIAL}$ are made equal in each cycle, i.e. $\Delta V_1=\Delta V_2=\Delta V$ in each cycle. Also the upward and downward adjustment values $V_{ADJ1}$ and $V_{ADJ2}$ are preferably made equal to one another in each cycle, i.e. $V_{ADJ1}=V_{ADJ2}=V_{ADJ}$. In the second embodiment, however, $V_{ADJ}$ is made equal to $\Delta V$ in each cycle, starting with $\Delta V/V_{fsc}=\frac{1}{4}$ in the first cycle, and thereafter scaling by a factor of two in each subsequent cycle as shown in Table 4 below.

TABLE 4

| CYCLE | $\Delta V/V_{fsc}$ | $V_{ADJ}/V_{fsc}$ |
|---|---|---|
| 1 | 1/4 | 1/4 |
| 2 | 1/8 | 1/8 |
| 3 | 1/16 | 1/16 |
| 4 | 1/32 | 1/32 |
| 5 | 1/64 | 1/64 |
| 6 | 1/128 | 1/128 |
| 7 | 1/256 | 1/256 |
| 8 | 1/512 | 1/512 |
| 9 | 1/1024 | 1/1024 |
| 10 | 1/2048 | 1/2048 |
| 11 | 1/4096 | 1/4096 |
| 12 | 1/8192 | 1/8192 |
| 13 | 1/16384 | 1/16384 |
| 14 | 1/32768 | 1/32768 |
| 15 | 1/65536 | 1/65536 |
| 16 | $(2^{-17})$ | $(2^{-17})$ |

Simulations employing the second embodiment of the present invention have demonstrated that it can provide a further improvement in conversion speed over the first embodiment whilst still employing the same analog circuits. For example, sufficient settling for an accurate final output value can be achieved in a time $T_2$ of just $0.67\tau$, as compared to $T_c=11\tau$ in the FIG. 1 conventional ADC and $T_1=1.25\tau$ in the first embodiment. This means that in the second embodiment the settling error in the first cycle (having a 1 V step size in 2 V full-scale ADC) can be as large as 0.510 mV (see FIG. 3) because errors of less than this magnitude will be corrected automatically in subsequent cycles.

Figure 7:
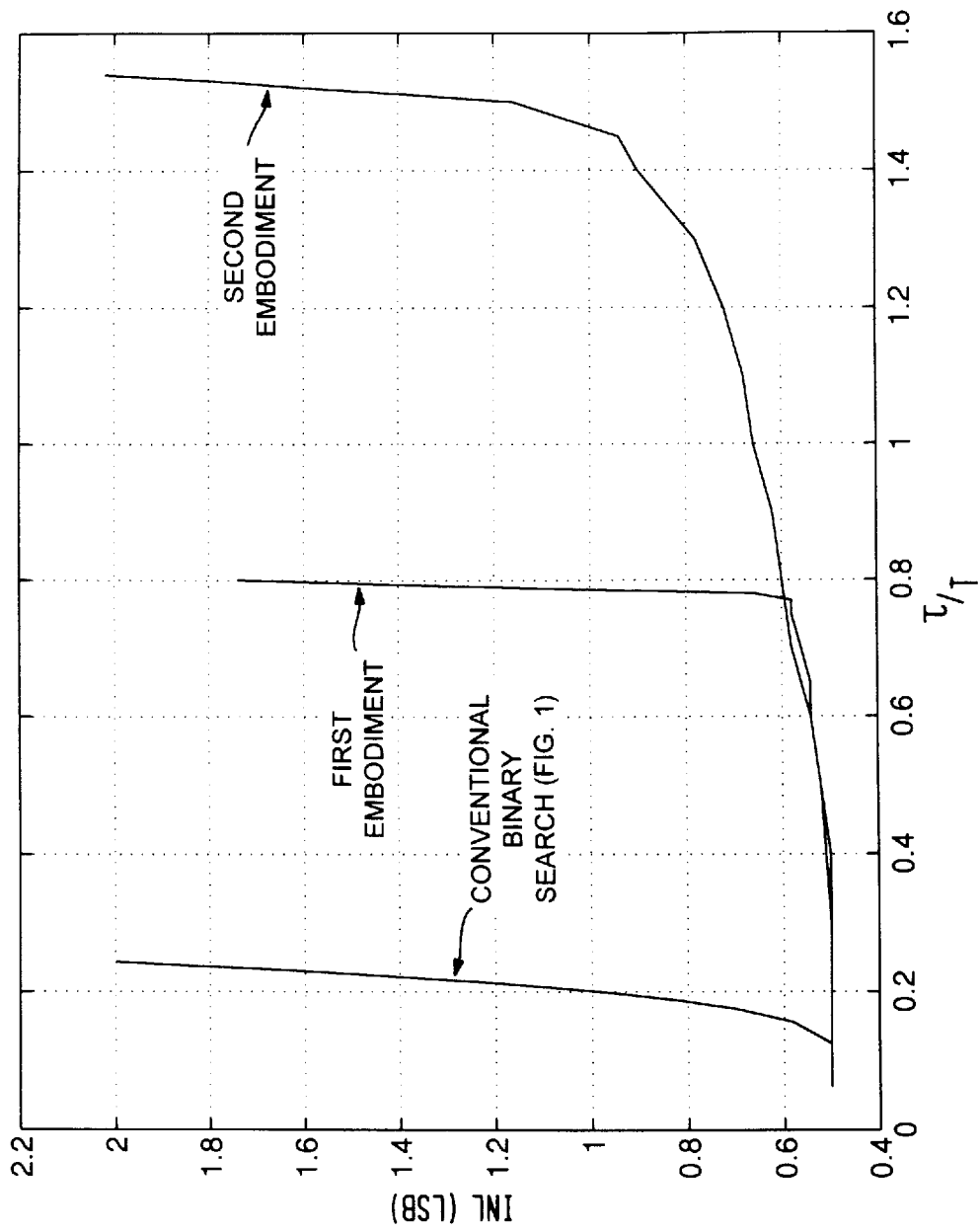
FIG. 7 shows a graph for use in comparing performance of the first embodiment and a second embodiment with that of the FIG. 1 conventional ADC.

FIG. 7 shows a graph comparing the simulated performance of the first and second embodiments and the conventional ADC of FIG. 1.

The horizontal axis in FIG. 7 shows the ratio $\tau/T$ of the settling time constant $\tau$ of the analog circuits to the average time T per comparison. The vertical axis in FIG. 7 shows the integral nonlinearity (INL) which is a measure of the biggest error that can occur. Ideal performance corresponds to an INL value of 0.5, but satisfactory performance is obtained up to an INL value of 1. Each simulation relates to a conversion with 16 bit precision lasting 32 clock periods: the conventional ADC of FIG. 1 has 16 "binary" conversion cycles of 2 clock periods each; the first and second embodiments each have 14 "three-state" conversion cycles of 2 clock periods each, followed by 2 binary conversion cycles of 2 clock periods each.

It is noted that the performance of the first and second embodiments is basically unchanged when the number of bits is changed. In the conventional ADC of FIG. 1, however, the performance changes according to the number of bits: the curve shifts to the left in FIG. 7 when the number of bits is increased.

The second embodiment can be implemented using the same successive-approximation register circuitry 22 as that shown in FIG. 4, although in the second embodiment it is not necessary to provide the flag register 42 and associated flag control circuit 44 because the DOHI flag is not used. A further simplification of the circuitry is possible in the second embodiment because $V_{ADJ}=\Delta V$ so that $\pm THR = \pm WEIGHT$.

Figure 8:
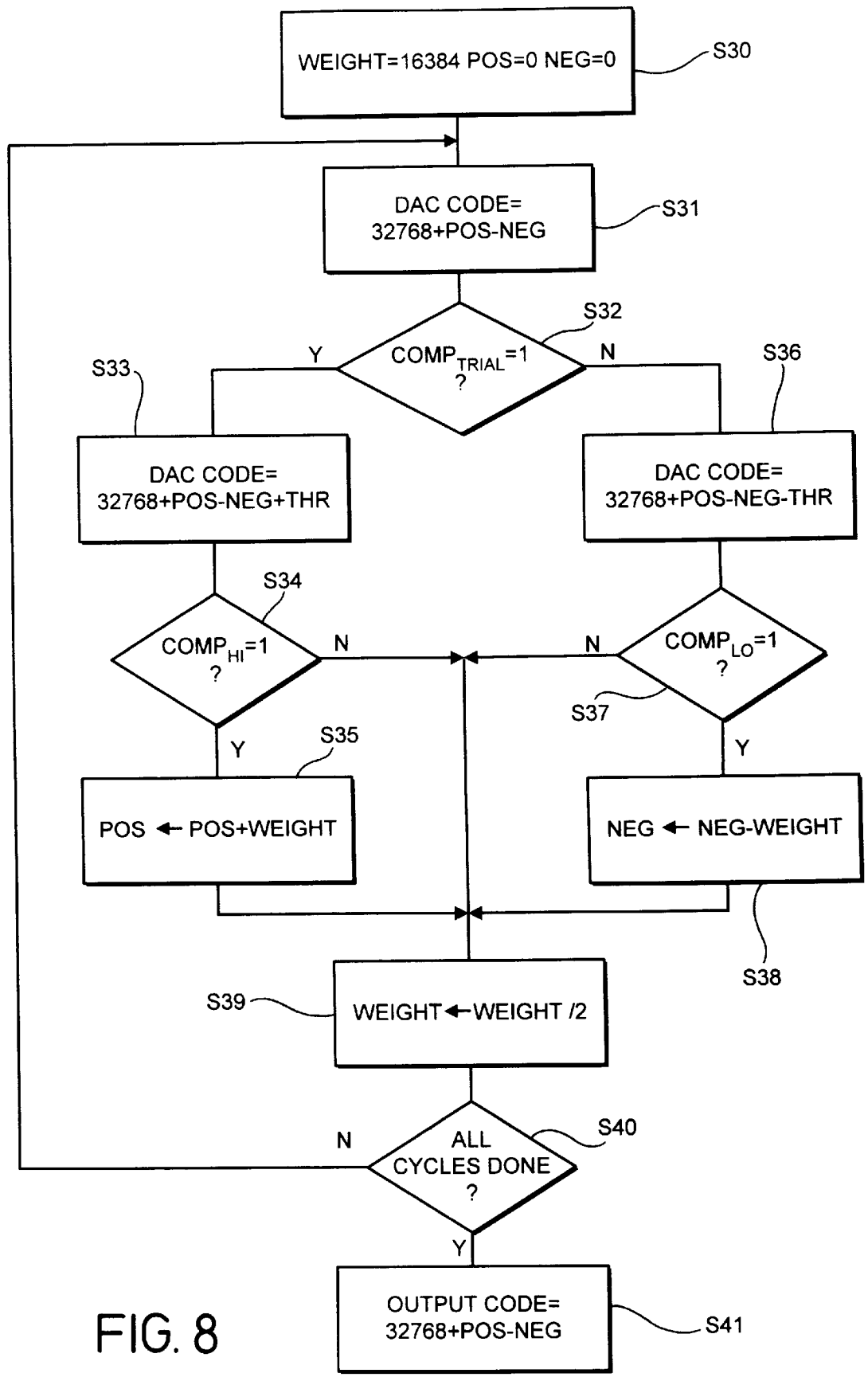
FIG. 8 shows a flowchart for use in explaining operation of the second embodiment of the present invention.

FIG. 8 shows the detailed operation of the second embodiment when the FIG. 4 SAR circuitry is employed.

In an initialisation step S30 the contents of the registers are set by the control circuit of the ADC to their respective initial values as follows:

WEIGHT=16384 ($2^{14}$), POS=0, NEG=0.

In step S31 the first conversion cycle commences and the SAR circuitry 22 performs the first comparison of the cycle by setting the digital input code of the DAC 5 (DAC code) to 32768+POS−NEG, which as POS and NEG are initially both zero, is equal to 32768. After sufficient time $T_2$ has elapsed for the DAC 5 and comparator 9 to settle (for example $T_2=0.67\tau$ as indicated above), the result $COMP_{TRIAL}$ is assessed in step S32.

If $COMP_{TRIAL}=1$ ($V_{IN}>V_{TRIAL}$) in the step S32, processing proceeds to step S33 in which the SAR circuitry 22 performs, as the second comparison of the cycle, the comparison of the input voltage $V_{IN}$ with the higher comparison voltage $V_{C1}$ and the DAC code is changed to 32768+POS−NEG+THR, which in cycle 1 is 49152 (48k) (THR=WEIGHT=16k initially).

In step S34 it is determined whether the result $COMP_{HI}$ of this second comparison is 1 ($V_{IN}>V_{C1}$) or 0 ($V_{IN} \leq V_{C1}$). If $COMP_{HI}=1$, POS is increased by WEIGHT in step S35; otherwise POS is left unchanged.

If, in step S32, the result $COMP_{TRIAL}$ of the first comparison of the cycle was found to be zero ($V_{IN} \leq V_{TRIAL}$) then processing proceeds to step S36 in which the SAR circuitry performs, as the second comparison of the cycle, a comparison between the input voltage $V_{IN}$ and the lower comparison voltage $V_{C2}$. To this end, the DAC code is set to 32768+POS−NEG−THR which, in cycle 1, is 16384 (16k). If, in step S37, the result $COMP_{LO}$ of this second comparison is found to be 1 ($V_{IN}<V_{C2}$) NEG is increased by WEIGHT in step S38; otherwise NEG is left unchanged.

The cycle ends by halving WEIGHT in step S39 and then in step S40 it is determined whether all of the conversion cycles have yet been completed. If not, processing returns to step S31 for the start of the next cycle. If it is determined in step S40 that all of the conversion cycles have been completed, the result OUTPUT of the conversion is calculated as 32768+POS−NEG, and this result is output by the converter.

As in the first embodiment, the last two bits of the output code are not produced using the three-state algorithm. Instead, the last two bits are produced as follows.

In cycle 15, $V_{TRIAL}$ is compared to $V_{IN}$ by setting the DAC code to 32768+POS−NEG and if the result is 1 ($V_{IN}>V_{TRIAL}$) POS is increased by 1; otherwise NEG is increased by 1. Thus, only one comparison is performed in cycle 15.

In cycle 16, $V_{TRIAL}$ is again compared to $V_{IN}$ by setting the DAC code to 32768+POS−NEG and if the result is 1 ($V_{IN}>V_{TRIAL}$) no change is made to POS or NEG; otherwise NEG is increased by 1. Thus, the final cycle 16 also only requires one comparison.

FIG. 9 shows an example of the operation of the second embodiment for the same analog input voltage $V_{IN}$ (1.2933 V) as in the FIG. 6 example above. The FIG. 9 example differs from the FIG. 6 example in that, assuming that the correct decision is made in each cycle, the trial voltage always remains lower than the input voltage in FIG. 9, whereas in FIG. 6 the trial voltage is sometimes above the input voltage (e.g. in cycles 2 and 5) and at other times below the input voltage (e.g. in cycles 3, 4 and 6). This difference is a consequence of the fact that in FIG. 9 $\Delta V$ (THR)=$V_{ADJ}$ (WEIGHT) in each cycle, so that only if the input voltage has been found to be higher than the comparison voltage $V_{C1}$ ($V_{TRIAL}+\Delta V$) is $V_{TRIAL}$ increased to $V_{C1}$.

It can also be seen from FIG. 9 that whenever the digital decision data is +1 or −1 the voltage that was used in the second comparison of the current cycle is also used in the first comparison of the next cycle, see for example cycles 2 and 3 and cycles 5 and 6.

It is advantageous in the second embodiment for the SAR circuitry to produce the DAC codes in the form of Gray codes, the DAC being adapted to be responsive to such Gary-coded DAC codes received at its digital input. The reason for this will be explained with reference to FIGS. 10 to 14.

Figure 10:
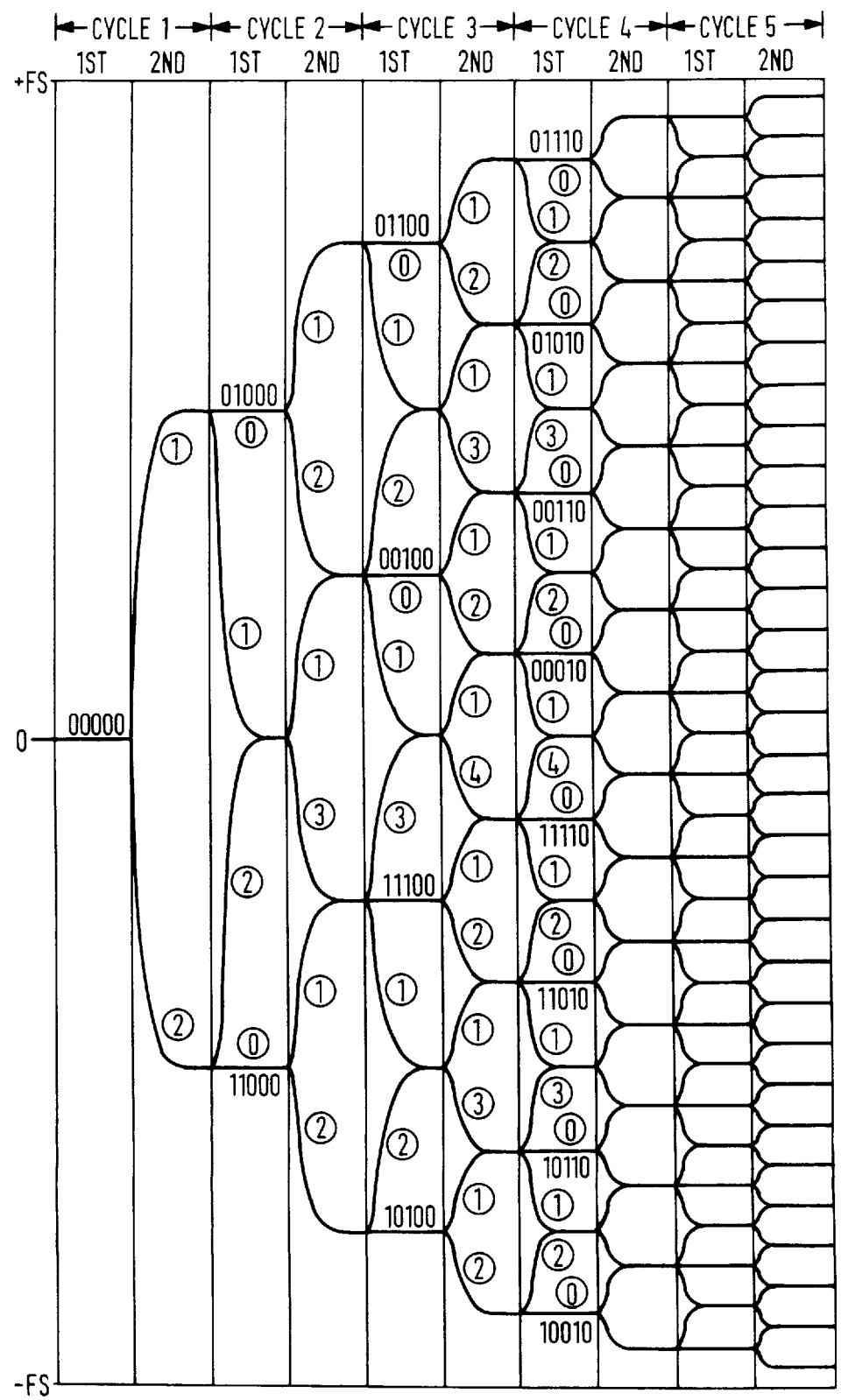
FIG. 10 shows a diagram representing operation of a first example of an ADC according to the second embodiment, in which binary codes are employed.
Figure 11:
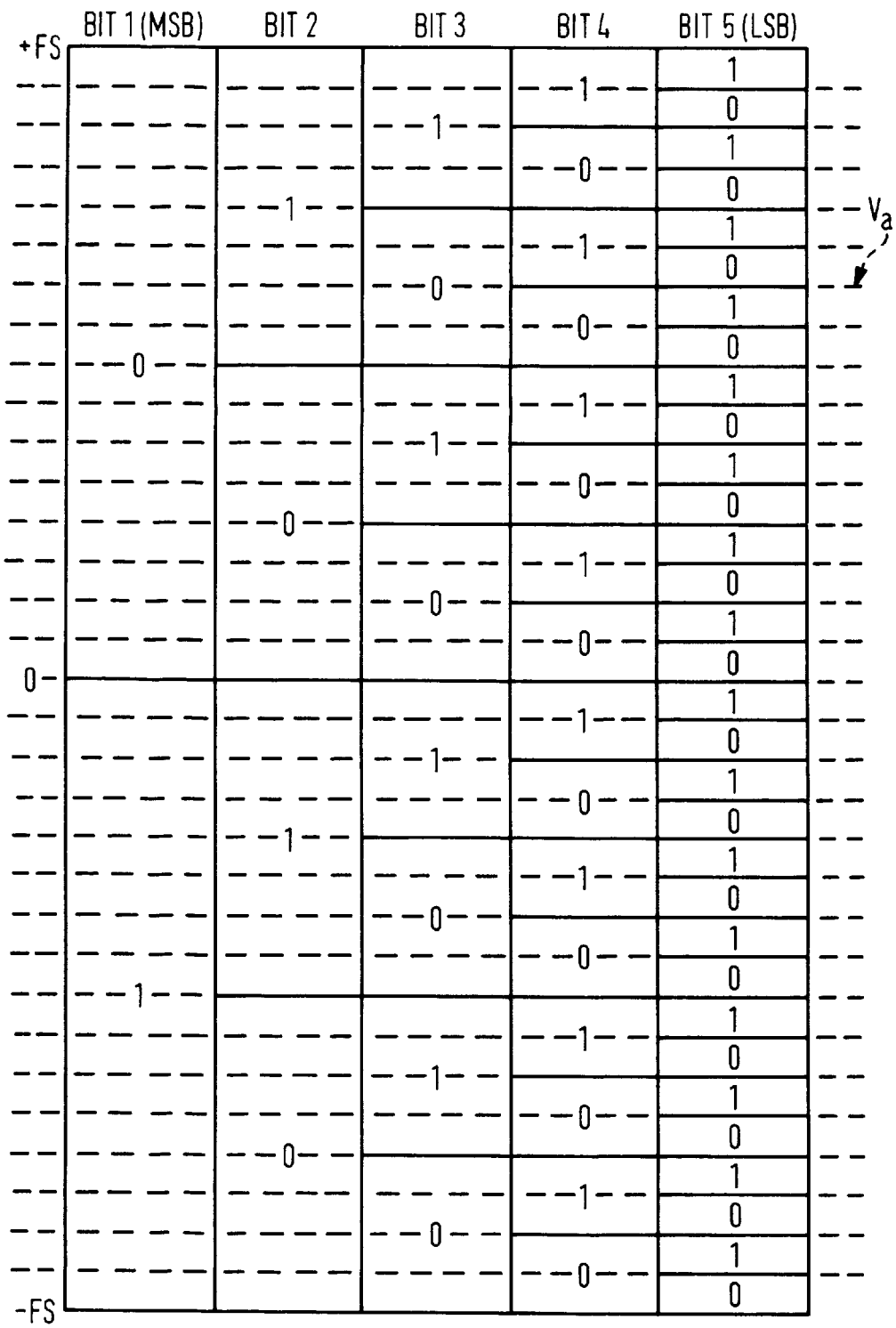
FIG. 11 shows the binary codes employed in the FIG. 10 ADC.

FIG. 10 shows an example in which the second embodiment is used to implement a 5 bit ADC. In this example, the SAR circuitry produces DAC codes in binary (2's complement) form, and FIG. 10 shows the possible analog comparison voltages used in each comparison of each of the five conversion cycles, together with (for cycles 1 to 3 and the first comparison of cycle 4) the DAC codes that must be applied to the DAC to cause these analog comparison voltages to be produced. The full set of codes is shown in FIG. 11. The dotted lines in FIG. 9 represent the different possible levels of the analog comparison voltage. The code required to produce a particular level is found by setting the value of each bit to the value shown in the box through which the dotted line passes; if the line coincides with the boundary between two boxes the value in the upper box is used. For example the level $V_a$ in FIG. 9 corresponds to the code "01010".

The ringed numbers in FIG. 10 show the number of bits of the DAC code which are changed in each comparison. In the second comparison of cycle 1, for example, the DAC code is changed from "00000" to either "01000" (1 bit changes) or "11000" (2 bits change). As FIG. 10 shows, generally, in the first comparison of a cycle i the DAC code may stay the same (no bits change) or up to i bits may change. In the second comparison of cycle i, at least 1 bit and at most i+1 bits of the DAC code change.

When the DAC code is changed by more than 1 bit a glitch may occur in the analog comparison voltage produced by the DAC 5, so that instead of changing smoothly as shown in FIG. 10, the voltage changes irregularly from its old value to its new value. Such glitches cause the required settling time of the analog circuits to increase, and the problem is more acute when several bits change as in cycles 3, 4 and 5.

Figure 12:
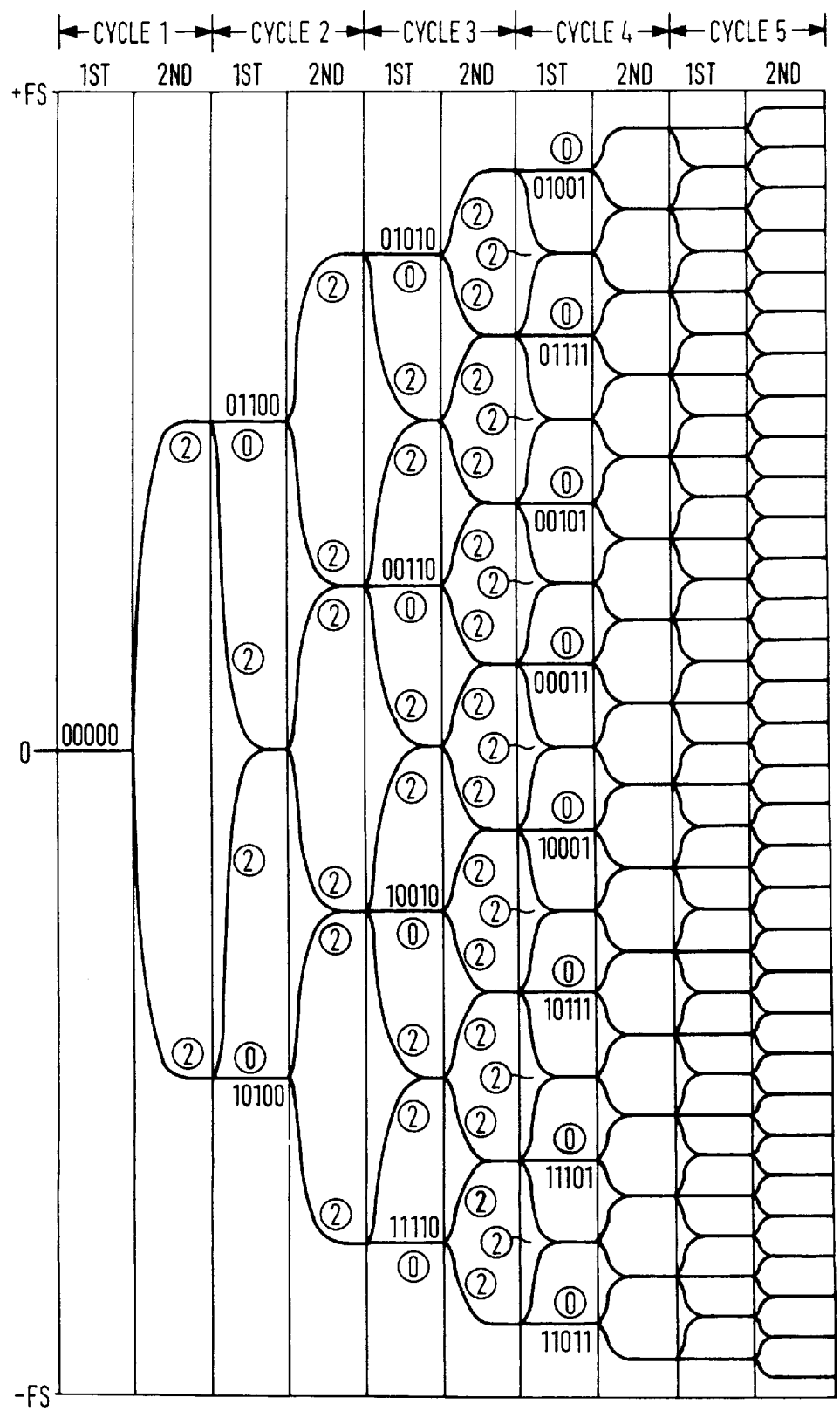
FIG. 12 shows a diagram representing operation of a second example of an ADC according to the second embodiment, in which Gray codes are employed.
Figure 13:
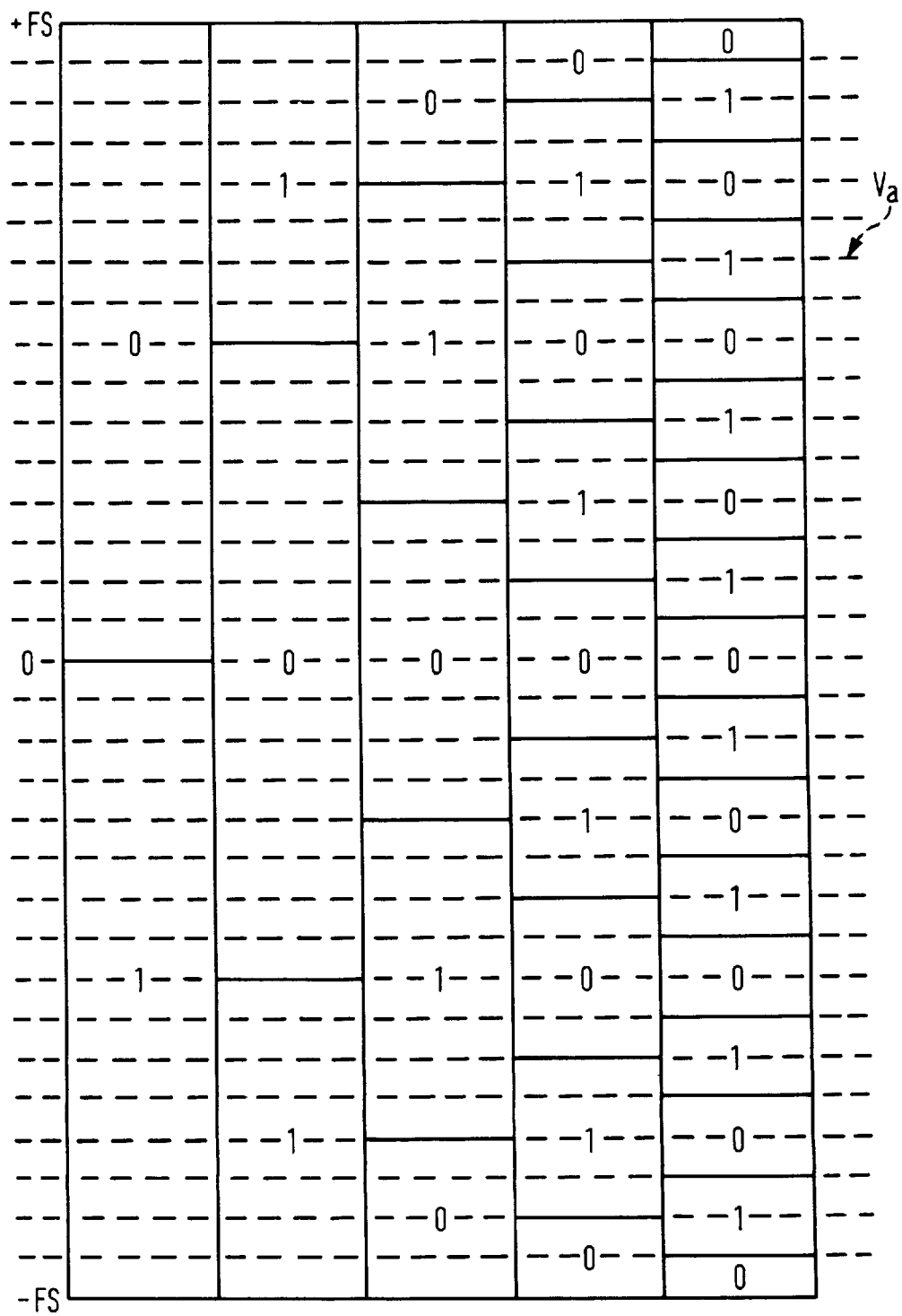
FIG. 13 shows the Gray codes employed in the FIG. 12 ADC.

To overcome this problem it is possible to use Gray codes in the SAR circuitry and to use a DAC that responds to such Gray codes. In this way, as shown in FIG. 12, it is possible to ensure that no more than 2 bits of the DAC code change in each comparison. In fact, in the first comparison the DAC code either stays the same or 2 bits of it change, and in the second comparison 2 bits always change. Accordingly, less glitches occur on average when using Gray codes (FIGS. 12/13) than when using normal binary (2's complement) codes (FIGS. 10/11). This means that settling of the analog circuits occurs more quickly. FIG. 13 shows the full set of Gray codes used in FIG. 12. In this case, the same level $V_a$ as was indicated in FIG. 11 corresponds to the Gray code "01111".

Figure 14:
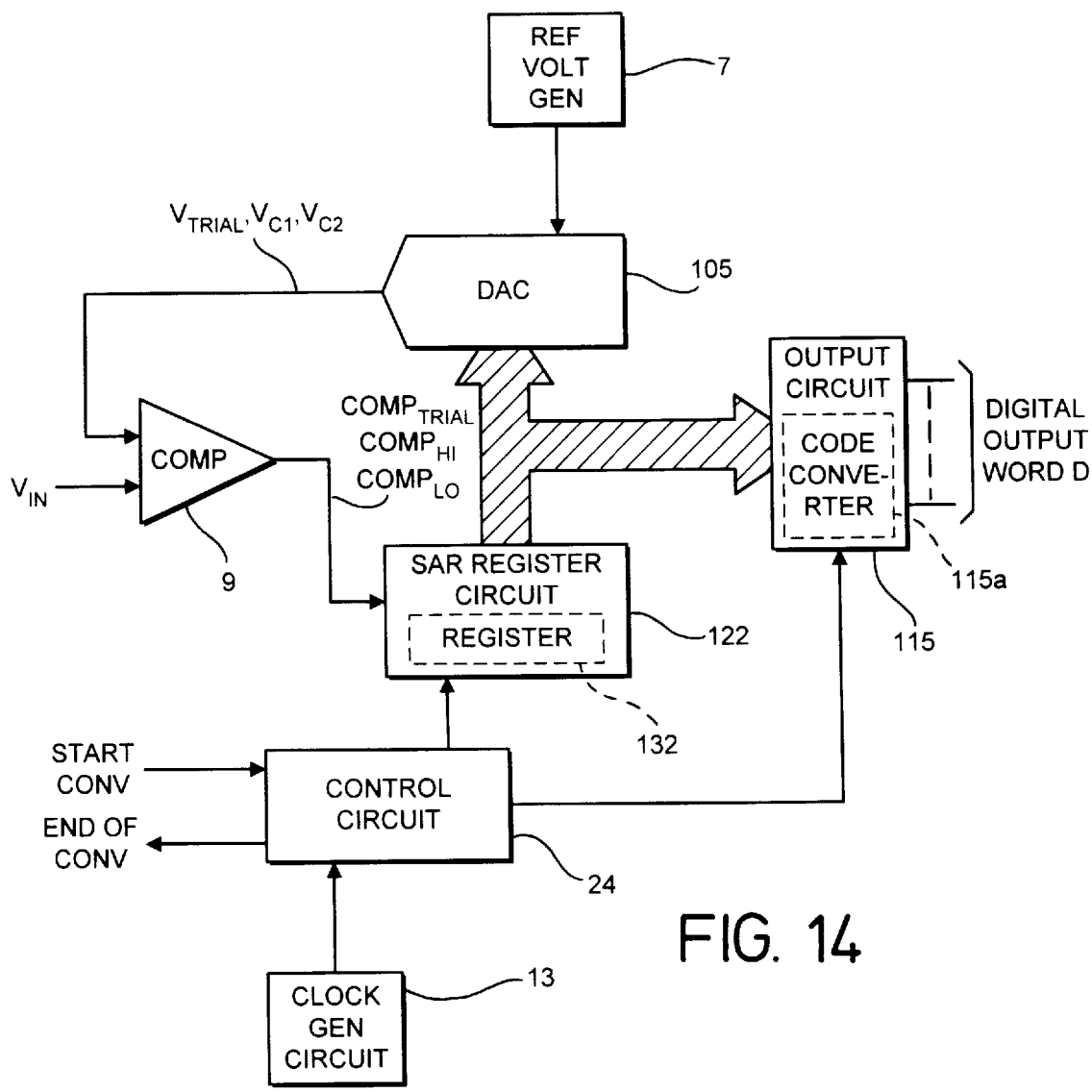
FIG. 14 shows a block circuit diagram of parts of the FIG. 12 ADC.

FIG. 14 shows a block circuit diagram of parts of an ADC according to the second embodiment in which Gray codes are used. The SAR circuitry 122 and DAC 105 are both modified as compared to the corresponding circuit elements of FIG. 2 so as to employ Gray codes instead of normal binary codes. The SAR circuitry 122 can use a single storage register 132 instead of the two storage registers 32 and 34 required in FIG. 4, and the bits of the single storage register 132 are set or reset directly so that the adder 38 can also be omitted. This simplifies the digital circuitry considerably, as well as avoiding glitches. A code converter 115a is additionally included in the output circuit 115, which serves at the end of the conversion to convert the final output code from Gray code form to normal binary form.

Figure 15:
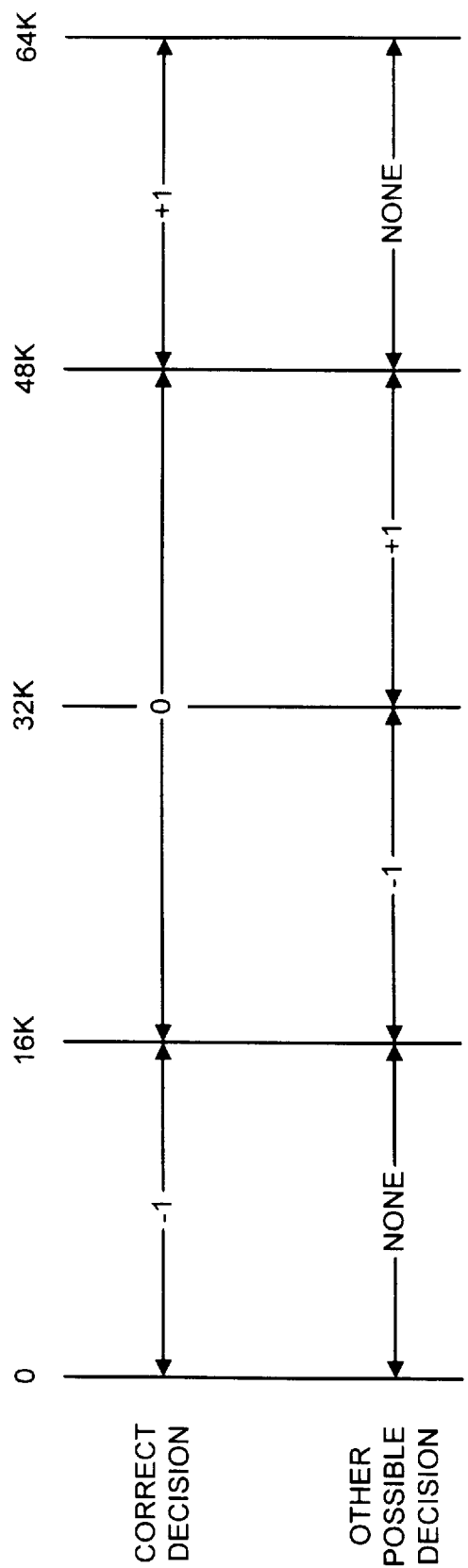
FIG. 15 shows a diagram for use in explaining how errors can be corrected in the second embodiment.

The self-correcting nature of the three-state algorithm can be illustrated by considering the first conversion cycle of the second embodiment in detail, with reference to FIG. 15.

In FIG. 15, the correct decisions in cycle 1 are "−1" when $V_{IN}<16k$, "+1" when $V_{IN}>48k$ and "0" when $16k \leq V_{IN} \leq 48k$. When $V_{IN}<16k$ or $>48k$ it is not possible to recover in later conversion cycles if the correct decision is not made in cycle 1 because the maximum sum of the possible adjustments in cycles 2 to 16 is ±15.999k (=16k−LSB(1)) and so in cycle 1 the trial value must be decreased to 16k if final values less than 16k are to be reached, or increased to 48k if final values greater than 48k are to be reached.

When $16k \leq V_{IN} \leq 48k$, however, it is possible to recover from a wrong decision in cycle 1. Take for example the case in which $V_{IN}=46.4k$. In cycle 1 the first comparison will be with 32k and the second comparison with 48k. Because $V_{IN}$ is so close to the second comparison value, there is a relatively high likelihood of an error being made in the second comparison so that $COMP_{HI}$ is taken to be 1 instead of 0. If so, the "wrong" decision (+1) is made in cycle 1 and the trial value is increased to 48k. However, in cycles 2, 3 and 4 the "right" decisions (0) are made, the second comparisons being with 40k, 44k and 46k respectively. Then, in cycle 5 the second comparison is with 47k and the result is −1 ($V_{IN}<47k$). Thus, the trial value is adjusted downwardly to 47k, starting convergence to the correct final value once more.

It can be seen from this that the error in cycle 1 is not fatal and that it is corrected automatically in subsequent cycles. Generally, for a converter having N cycles, if an error is made in cycle 1, recovery is possible when N $$|V_{TRIAL(i+1)} - V_{IN}| < \sum_{x=2}^{N} V_{ADJ(x)}$$

where $V_{ADJ(X)}$ is the adjustment value in cycle x, and $V_{TRIAL(i+1)}$ is the trial value in cycle i+1.

Since $$V_{ADJ(i)} = \sum_{x=i+1}^{N} V_{ADJ(x)} + LSB(1)$$

recovery from an error in cycle i is possible if:

$|V_{TRIAL(i+1)} - V_{IN}| < V_{ADJ(i)}$

In the conventional binary search algorithm, each conversion cycle has just one comparison in which $V_{IN}$ is compared directly with $V_{TRIAL}$.

If $V_{IN>VTRIAL}$, $$V_{TRIAL(i+1)} = V_{TRIAL(i)} + V_{ADJ(i)} \quad (\text{"1"})$$

Otherwise, $$V_{TRIAL(i+1)} = V_{TRIAL(i)} - VADJ(i) \quad (\text{"0"})$$

where $V_{TRIAL(1)} = \frac{1}{2} V_{fsc}$, $V_{ADJ(1)} = \frac{1}{4} V_{fsc}$, and $V_{ADJ(i+1)} = \frac{1}{2} V_{ADJ(i)}$.

If the wrong decision is made in any cycle, there is no possibility of recovery.

Take an example in which $V_{IN}=33.6k$. The initial trial voltage $V_{TRIAL(I)}=32k$. The correct decision in cycle 1 would be 1, so that $V_{TRIAL(2)}=48k$, but an incorrect decision (0) in cycle 1 results in $V_{TRIAL(2)}$ being 16k. In this case, since $\Sigma V_{ADJ(i)}=15.999k$, the final trial value after cycle 16 can only reach 32k −LSB(1), and so recovery to the required value of 33.6k is impossible.

Figure 16A:
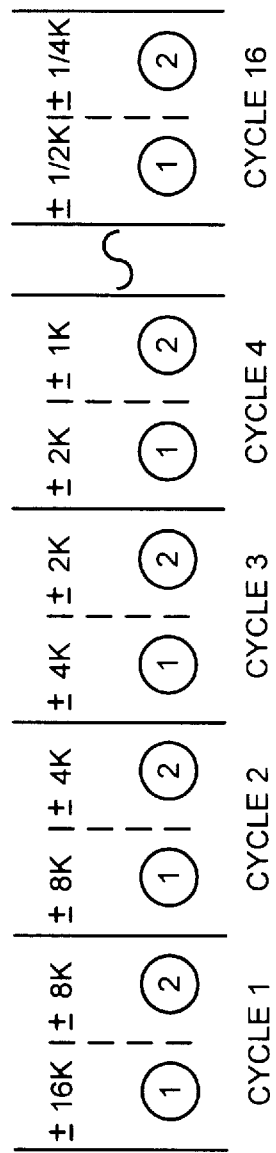
FIGS. 16A and 16B show respective diagrams for use in explaining operation of a third embodiment of the present invention.

In accordance with a second aspect of the present invention, however, it is possible to modify the conventional binary search algorithm to include an error recovery capability. For example, in a third embodiment of the present invention shown in FIG. 16A, it is possible to perform two comparisons per cycle, the trial value being adjusted by the "normal" amount (normal for the cycle concerned of the conventional binary search algorithm) in dependence upon the result of the first comparison and this adjusted trial value being used in the second comparison and being adjusted again in dependence upon the result of that second comparison by a further amount that is smaller than the above-mentioned "normal" amount, for example half the normal amount. Thus, in the first cycle the "normal" adjustment amount is ±16k and the further adjustment amount is ±8k; in cycle 2 the normal and further adjustment amounts are each halved to ±8k and ±4k respectively, and so on for further cycles. When 16 bit accuracy is required, there are 16 cycles in total and 32 comparison operations.

Figure 16B:
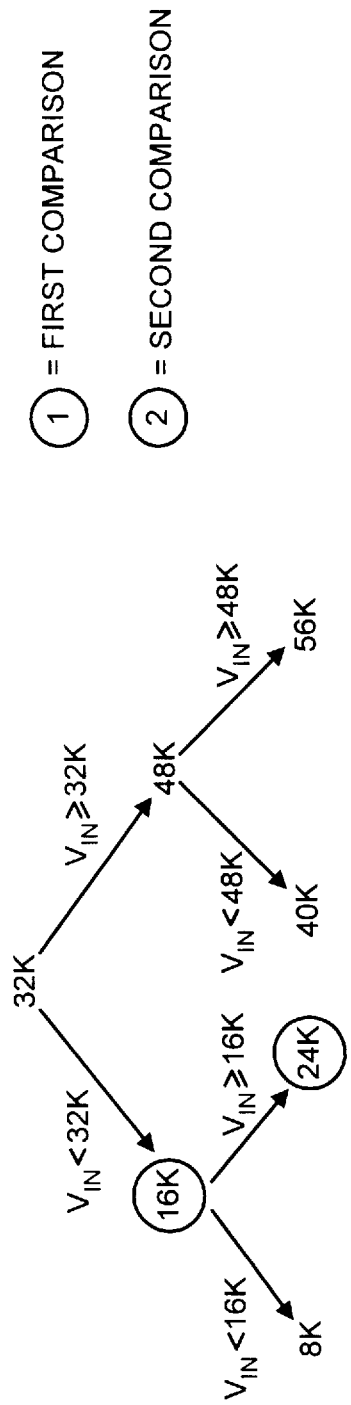

FIG. 16B shows the decision tree for cycle 1. Using the same example as above, in which $V_{IN}$=33.6k, suppose that in the first comparison the wrong result is obtained so that $V_{TRIAL}$ is set to 16k for the second comparison. Provided that the second comparison is performed correctly, $V_{TRIAL}$ ends up being set to 24k at the end of cycle 1. In this case the sum of the further possible adjustments in cycles 2 to 16 is 23.999k (24k−LSB(1)) so that the final trial value can reach 47.999k and recovery from the error in cycle 1 is possible.

It will be seen that the FIG. 16 modified algorithm involves twice as many actual comparisons in total as the conventional binary search algorithm because N cycles of two comparisons each are required for N bit precision of the final output code (one bit of the final output code is determined per cycle of two comparisons). However, as in the first and second embodiments described above, the analog circuits can be operated faster than in the conventional binary search algorithm because if errors are made due to incomplete settling of the analog circuits these errors can be corrected in subsequent cycles.

Figure 17A:
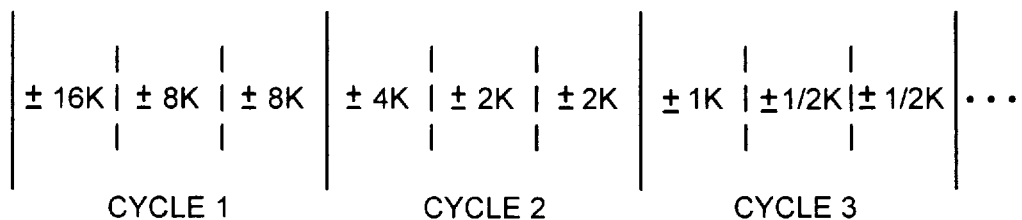
FIGS. 17A and 17B are diagrams corresponding respectively to FIGS. 16A and 16B but relating to a fourth embodiment of the present invention.
Figure 17B:
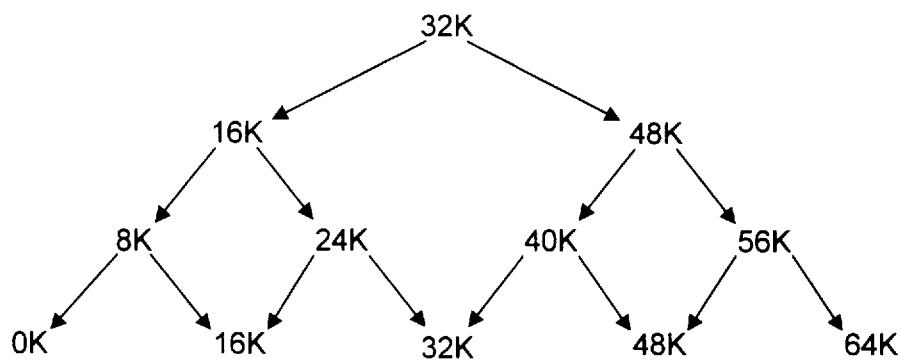
Figure 17C:
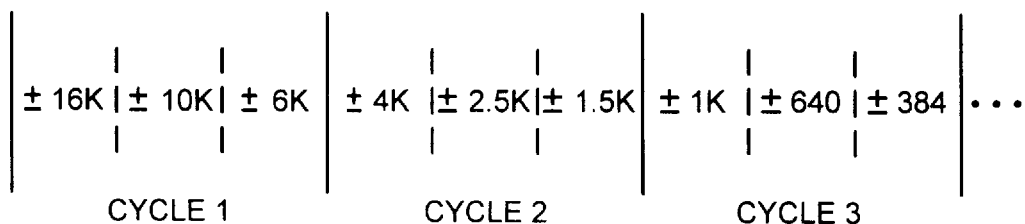
FIG. 17C shows a diagram relating to a variation of the fourth embodiment.

Many variations on the FIG. 16 embodiment are possible. For example, FIG. 17A shows a fourth embodiment of the invention in which the number of comparisons is reduced as compared to the third embodiment of FIG. 16. In FIG. 17A, each cycle includes three comparisons, but in this embodiment only N/2 cycles are required because each cycle determines two bits of the final output code. For example, for 16 bit precision, eight cycles are required. Thus, effectively the fourth embodiment involves 1.5 comparisons per bit of the final output code. The decision tree for cycle1 is shown in FIG. 17B. FIG. 17C shows a variation on FIG. 17A in which the adjustment values used in the second and third comparisons of each cycle are different from those in the second and third comparisons of FIG. 17A.

It would also be possible to achieve an error recovery capability by performing four comparisons in each cycle and using the results to set three bits (or less) of the final output code, or by performing five comparisons in each cycle and using the results to set four bits (or less) of the final output code. Generally, if each cycle sets n bits of the final output code, then m (m>n) comparisons are required per cycle to build in an error recovery capability. The first and second embodiments described above correspond to the case in which n=1 and m=2.

It is not essential for all of the conversion cycles to be identical. For example, FIG. 18A shows the cycles of the conventional binary search algorithm and FIG. 18B shows that every third cycle is a correction cycle C which simply includes two (in this case identical) comparisons.

Just one such correction cycle can be included if desired. For example, in a 16 bit ADC, when the conventional binary search algorithm of FIG. 18A is used, the comparison time $T_C$=11τ is required if the first comparison is to be accurate to 16 bits. However, only 5.5τ is required for the first comparison to be accurate to 8 bits, i.e. for the 8 most significant bits to be correct. This means that with a comparison time of 5.5τ an error of ±256 could be present after cycle 8. If cycle 8 is made a correction cycle C, as in a sixth embodiment of the present invention shown in FIG. 18C, the comparison of cycle 8 of FIG. 18A is repeated to enable the error to be corrected. After this, the cycles 9 to 16 are performed as in the conventional algorithm of FIG. 13A, but again with a comparison time of 5.5τ. Each comparison in FIG. 18C can be performed in half the time required in FIG. 18C, and only one extra comparison is required half-way through the conversion. Thus, instead of 16 full-length (11τ) comparisons, the sixth embodiment has 17 half-length (5.5τ) comparisons, virtually doubling the conversion speed.

As described above, by applying the "three-state" algorithm (first and second embodiments) or the modified binary search algorithm (third, fourth, fifth and sixth embodiments) to a successive-approximation ADC, a significant increase in the conversion speed can be obtained, as compared to the conventional "binary search" algorithm, and no modification to the analog circuits is required. The required modification of the successive-approximation register circuitry involves only the addition of a few hundred logic gates.

The improvement can be obtained in any type of successive-approximation ADC, and any suitable DAC and comparator architectures can be used.

It will be appreciated that, in the first embodiment, in a typical conversion there will be some conversion cycles in which only one comparison needs to be performed. It would be possible to take advantage of these "one-comparison" cycles to gain extra time for use at the end of the conversion sequence to allow extra settling time for the final bits of the output code. For example the final two conversion cycles, in which a single "binary" comparison is performed, could each be made twice or three times the length of the preceding "three-state" cycles.

It will be understood that the successive-approximation register circuitry (22 of FIG. 4; 122 of FIG. 14) and the control circuit 24 of the FIGS. 2/4 can alternatively be implemented using a micro-controller operating under program control, rather than by dedicated hardware circuitry.

Similarly, in a personal computer or the like which performs analog-to-digital conversion using a successive approximation technique by operating a DAC device (forming part of the input/output circuitry of the computer) under software control, the conversion program could be altered to make use of the "three-state" algorithm or the modified binary search algorithm described in the present application.

What we claim is:

1. A successive approximation analog-to-digital converter operable repetitively to perform a series of conversion cycles and including:

comparator means connected for receiving an analog input signal and operable in each such conversion cycle to produce digital data that has a first value when the input signal value is greater than a first comparison value and that has a second value when said input signal value is less than a second comparison value and that in all other cases has a third value, said first comparison value being greater than a trial signal value determined by the converter for use in the cycle concerned and differing from that trial signal value by a first predetermined amount, and said second comparison value being less than said trial signal value and differing therefrom by a second predetermined amount; and successive approximation means operable in each conversion cycle to adjust said trial signal value in dependence upon said digital data produced in the cycle concerned so as to tend to bring that value into closer correspondence with said input signal value.

2. The successive approximation analog-to-digital converter as claimed in claim 1 wherein the adjustment amounts applicable to said trial signal value by said successive approximation means in the conversion cycles of said series are predetermined so that, in at least one conversion cycle of said series other than the last conversion cycle, if an adjustment is made in the cycle concerned as a result of an error in the digital data value produced in that cycle, the amount of that adjustment is such that, for at least one input-signal value, the adjusted trial signal value differs from the input-signal value by no more than the maximum sum of the possible adjustment amounts in subsequent cycles of the series.

3. The successive approximation analog-to-digital converter as claimed in claim 2, wherein in each conversion cycle said successive approximation means increase said trial signal value by a predetermined upward adjustment amount when said digital data produced in the conversion cycle concerned has said first value and decrease said trial signal value by a predetermined downward adjustment amount when that digital data has said second value, and leave the trial signal value unchanged when that digital data has said third value.

4. The successive approximation analog-to-digital converter as claimed in claim 3, wherein said predetermined upward adjustment amount is equal to said predetermined downward adjustment amount in each conversion cycle.

5. The successive approximation analog-to-digital converter as claimed in claim 3, wherein said predetermined upward adjustment amount in one conversion cycle is substantially half that in the preceding conversion cycle, and said predetermined downward adjustment amount in one conversion cycle is substantially half that in the preceding conversion cycle.

6. The successive approximation analog-to-digital converter as claimed in claim 2, wherein said trial signal value is initially substantially half the full-scale input signal value of the converter.

7. The successive approximation analog-to-digital converter as claimed in claim 2, wherein said first, second and third values of said digital data are +1, −1 and 0, respectively.

8. The successive approximation analog-to-digital converter as claimed in claim 2, wherein, for at least one pair of successive conversion cycles, said first predetermined amount in the later cycle of the pair is reduced as compared to said first predetermined amount in the earlier cycle of the pair, and/or said second predetermined amount in the later cycle of the pair is reduced as compared to said second predetermined amount in the earlier cycle of the pair.

9. The successive approximation analog-to-digital converter as claimed in claim 2, wherein, for at least one pair of successive conversion cycles, said first predetermined amount in the later cycle of the pair is substantially half said first predetermined amount in the earlier cycle of the pair, and said second predetermined amount in the later cycle of the pair is substantially half said second predetermined amount in the earlier cycle of the pair.

10. The successive approximation analog-to-digital converter as claimed in claim 2, wherein in each conversion cycle said first predetermined amount is equal to said second predetermined amount.

11. The successive approximation analog-to-digital converter as claimed in claim 2, wherein said successive approximation means include:

digital register means for storing the digital data produced by said comparator means in each cycle; and data processing means connected to said digital register means for employing the stored digital data to selectively derive digital code data corresponding to one of said first and second comparison values or to said trial signal value;

and said comparator means include digital-to-analog conversion means connected to said data processing means for producing an analog comparison signal corresponding to the digital code data, and an analog comparator for comparing said analog input signal and said analog comparison signal to produce said digital data.

12. The successive approximation analog-to-digital converter as claimed in claim 11, wherein said data processing means produce the digital code data in the form of Gray codes, and said digital-to-analog conversion means are responsive to such Gray codes.

13. The successive approximation analog-to-digital converter as claimed in claim 2, wherein the adjustment amounts applicable to said trial signal value by said successive approximation means in the conversion cycles of said series are predetermined so that, in any one conversion cycle of said series other than the last conversion cycle, if an adjustment is made in the cycle concerned as a result of an error in the digital data value produced in that cycle, the amount of that adjustment is such that, for at least one input-signal value, the adjusted trial signal value differs from the input-signal value by no more than the maximum sum of the possible adjustment amounts in subsequent cycles of the series.

14. The successive approximation analog-to-digital converter as claimed in claim 2, wherein said comparator means are operable selectively in each conversion cycle to perform a first comparison in which said input signal value is compared with one of said first and second comparison values and then to perform a second comparison in which the input signal value is compared with the other of those two comparison values.

15. The successive approximation analog-to-digital converter as claimed in claim 14, wherein said comparator means do not perform said second comparison if the result of said first comparison makes the second comparison superfluous.

16. The successive approximation analog-to-digital converter as claimed in claim 14, wherein said comparator means select for use in said first comparison of each conversion cycle that one of said first and second comparison values which differs most from the comparison value used in the final comparison of the previous conversion cycle.

17. The successive approximation analog-to-digital converter as claimed in claim 14, wherein said comparator means employ in the first comparison of the first conversion cycle that one of said first and second comparison values which differs most from said input signal value.

18. The successive approximation analog-to-digital converter as claimed in claim 14, wherein:

in each conversion cycle said successive approximation means increase said trial signal value by a predetermined upward adjustment amount when said digital data produced in the conversion cycle concerned has said first value and decrease said trial signal value by a predetermined downward adjustment amount when that digital data has said second value, and leave the trial signal value unchanged when that digital data has said third value; and in each conversion cycle said predetermined upward adjustment amount is substantially double said first predetermined amount and said predetermined downward adjustment amount is substantially double said second predetermined amount.

19. The successive approximation analog-to-digital converter as claimed in claim 14, wherein said first and second predetermined amounts are initially substantially equal to one-eighth of the full-scale input signal value of the converter.

20. The successive approximation analog-to-digital converter as claimed in claim 2, wherein said comparator means are operable in each conversion cycle to perform a first comparison in which said input signal value is compared with said trial signal value and then to perform a second comparison in which said input signal value is compared with said first comparison value when the result of said first comparison is that the input signal value is greater than the trial signal value and is compared with said second comparison value when the result of said first comparison is that the input signal value is less than said trial signal value.

21. The successive approximation analog-to-digital converter as claimed in claim 20, wherein:
in each conversion cycle said successive approximation means increase said trial signal value by a predetermined upward adjustment amount when said digital data produced in the conversion cycle concerned has said first value and decrease said trial signal value by a predetermined downward adjustment amount when that digital data has said second value, and leave the trial signal value unchanged when that digital data has said third value; and
in each conversion cycle said predetermined upward adjustment amount is substantially equal to said first predetermined amount, and said predetermined downward adjustment amount is substantially equal to said second predetermined amount.

22. The successive approximation analog-to-digital converter as claimed in claim 20, wherein said first and second predetermined amounts are initially substantially equal to one-quarter of the full-scale input signal value of the converter.

23. The successive approximation analog-to-digital converter as claimed in claim 2, wherein said data processing means produce the digital code data in the form of Gray codes, and said digital-to-analog conversion means are responsive to such Gray codes.

24. The successive approximation analog-to-digital converter as claimed in claim 1, wherein said comparator means are operable selectively in each conversion cycle to perform a first comparison in which said input signal value is compared with one of said first and second comparison values and then to perform a second comparison in which the input signal value is compared with the other of those two comparison values.

25. The successive approximation analog-to-digital converter as claimed in claim 24, wherein said comparator means do not perform said second comparison if the result of said first comparison makes the second comparison superfluous.

26. The successive approximation analog-to-digital converter as claimed in claim 24, wherein said comparator means select for use in said first comparison of each conversion cycle that one of said first and second comparison values which differs most from the comparison value used in the final comparison of the previous conversion cycle.

27. The successive approximation analog-to-digital converter as claimed in claim 24, wherein said comparator means employ in the first comparison of the first conversion cycle that one of said first and second comparison values which differs most from said input signal value.

28. The successive approximation analog-to-digital converter as claimed in claim 24, wherein:
in each conversion cycle said successive approximation means increase said trial signal value by a predetermined upward adjustment amount when said digital data produced in the conversion cycle concerned has said first value and decrease said trial signal value by a predetermined downward adjustment amount when that digital data has said second value, and leave the trial signal value unchanged when that digital data has said third value; and
in each conversion cycle said predetermined upward adjustment amount is substantially double said first predetermined amount and said predetermined downward adjustment amount is substantially double said second predetermined amount.

29. The successive approximation analog-to-digital converter as claimed in claim 24, wherein said first and second predetermined amounts are initially substantially equal to one-eighth of the full-scale input signal value of the converter.

30. The successive approximation analog-to-digital converter as claimed in claim 1, wherein said comparator means are operable in each conversion cycle to perform a first comparison in which said input signal value is compared with said trial signal value and then to perform a second comparison in which said input signal value is compared with said first comparison value when the result of said first comparison is that the input signal value is greater than the trial signal value and is compared with said second comparison value when the result of said first comparison is that the input signal value is less than said trial signal value.

31. An analog-to-digital converter as claimed in claim 30, wherein:
in each conversion cycle said successive approximation means increase said trial signal value by a predetermined upward adjustment amount when said digital data produced in the conversion cycle concerned has said first value and decrease said trial signal value by a predetermined downward adjustment amount when that digital data has said second value, and leave the trial signal value unchanged when that digital data has said third value; and
in each conversion cycle said predetermined upward adjustment amount is substantially equal to said first predetermined amount, and said predetermined downward adjustment amount is substantially equal to said second predetermined amount.

32. The successive approximation analog-to-digital converter as claimed in claim 30, wherein said first and second predetermined amounts are initially substantially equal to one-quarter of the full-scale input signal value of the converter.

33. The successive approximation analog-to-digital converter operable repetitively to perform a series of conversion cycles and including:
comparator means connected for receiving an analog input signal and operable in each such conversion cycle to produce digital data that has a first value when the input signal value is greater than a comparison value and that otherwise has a second value, the comparison value being dependent upon a trial signal value determined by the converter for use in the cycle concerned; and
successive approximation means operable in each conversion cycle to adjust said trial signal value in dependence upon said digital data produced in the cycle concerned so as to tend to bring that value into closer correspondence with said input signal value;
wherein at least one conversion cycle of said series is a correction cycle in which the comparator means are operated more than once so that respective first and second comparisons are performed in the correction cycle, and said successive approximation means are operable in the correction cycle to employ the digital data produced respectively by the first and second comparisons when adjusting said trial signal value.

34. The successive approximation analog-to-digital converter as claimed in claim 33, wherein said comparison value employed in said second comparison of said correction cycle is dependent upon said digital data produced by the first comparison.

35. The successive approximation analog-to-digital converter as claimed in claim 33, wherein in said correction cycle the successive approximation means determine n bits of the trial signal value, where n is an integer greater than or equal to 1, and said comparator means perform m comparisons, where m is an integer greater than n.

36. The successive approximation analog-to-digital conversion method, for producing a digital signal that corresponds to an analog input signal, including a series of conversion cycles, each conversion cycle comprising the steps of:

producing digital data that has a first value when the input signal value is greater than a first comparison value and that has a second value when said input signal value is less than a second comparison value and that in all other cases has a third value, said first comparison value being greater than a trial signal value determined for use in the cycle concerned and differing from that trial signal value by a first predetermined amount, and said second comparison value being less than said trial signal value and differing therefrom by a second predetermined amount; and adjusting said trial signal value in dependence upon said digital data produced in the cycle concerned so as to tend to bring that value into closer correspondence with said input signal value.

37. The successive approximation analog-to-digital conversion method as claimed in claim 36 wherein the adjustment amounts applicable to said trial signal value in the conversion cycles of said series are predetermined so that, in at least one conversion cycle of said series other than the last conversion cycle, if an adjustment is made in the cycle concerned as a result of an error in the digital data value produced in that cycle, the amount of that adjustment is such that, for at least one input-signal value, the adjusted trial signal value differs from the input-signal value by no more than the maximum sum of the possible adjustment amounts in subsequent cycles of the series.

38. The successive approximation analog-to-digital conversion method as claimed in claim 37, wherein the adjustment amounts applicable to said trial signal value in the conversion cycles of said series are predetermined so that, in any one conversion cycle of said series other than the last conversion cycle, if an adjustment is made in the cycle concerned as a result of an error in the digital data value produced in that cycle, the amount of that adjustment is such that, for at least one input-signal value, the adjusted trial signal value differs from the input-signal value by no more than the maximum sum of the possible adjustment amounts in subsequent cycles of the series.

39. The successive approximation analog-to-digital conversion method, for producing a digital signal that corresponds to an analog input signal, including a series of conversion cycles, each conversion cycle comprising the steps of:

making a comparison between the input signal value and a comparison value and producing digital data that has a first value when the input signal value is greater than the comparison value and that otherwise has a second value, the comparison value being dependent upon a trial signal value determined for use in the cycle concerned; and adjusting said trial signal value in dependence upon said digital data produced in the cycle concerned so as to tend to bring that value into closer correspondence with said input signal value;

wherein at least one conversion cycle is a correction cycle in which respective first and second such comparisons are made and in which the digital data produced respectively by the first and second comparisons is employed when adjusting said trial signal value.

* * * * *

UNITED STATES PATENT AND TRADEMARK OFFICE
CERTIFICATE OF CORRECTION

PATENT NO. : 5,870,052

DATED : February 9, 1999

INVENTOR(S) : Ian Juso Dedic, et al.

It is certified that error appears in the above-identified patent and that said Letters Patent is hereby corrected as shown below:

Column 21, line 59, after "in" insert --1 and--.

Signed and Sealed this

Fifth Day of October, 1999

Attest:

Q. TODD DICKINSON

Attesting Officer

Acting Commissioner of Patents and Trademarks